(12) United States Patent
Stevenson et al.

(10) Patent No.: US 10,730,074 B2
(45) Date of Patent: Aug. 4, 2020

(54) PIEZOELECTRIC TRANSDUCERS

(71) Applicant: Ionix Advanced Technologies Ltd, Huddersfield, West Yorkshire (GB)

(72) Inventors: Timothy James Stevenson, Yeadon (GB); Timothy Paul Alistair Comyn, Leeds (GB)

(73) Assignee: Ionix Advanced Technologies Ltd, Huddersfield, West Yorkshire (GB)

( * ) Notice: Subject to any disclaimer, the term of this patent is extended or adjusted under 35 U.S.C. 154(b) by 260 days.

(21) Appl. No.: 15/548,815

(22) PCT Filed: Feb. 5, 2016

(86) PCT No.: PCT/GB2016/050270
§ 371 (c)(1),
(2) Date: Aug. 4, 2017

(87) PCT Pub. No.: WO2016/124941
PCT Pub. Date: Aug. 11, 2016

(65) Prior Publication Data
US 2018/0015505 A1    Jan. 18, 2018

(30) Foreign Application Priority Data
Feb. 5, 2015 (GB) .................................. 1501923.5

(51) Int. Cl.
*B06B 1/06* (2006.01)
*H01L 41/187* (2006.01)
(Continued)

(52) U.S. Cl.
CPC .......... *B06B 1/0685* (2013.01); *B06B 1/0622* (2013.01); *B06B 1/0644* (2013.01);
(Continued)

(58) Field of Classification Search
CPC .... H01L 41/18; H01L 41/187; H01L 41/1878
(Continued)

(56) References Cited

U.S. PATENT DOCUMENTS

| 4,439,497 A | 3/1984 | DiFoggio |
| 4,821,584 A | 4/1989 | Lembke |

(Continued)

FOREIGN PATENT DOCUMENTS

| CN | 101019247 A | 8/2007 |
| JP | S55-150560 U | 10/1980 |

(Continued)

OTHER PUBLICATIONS

Jiang, Xiaoning et al: "High-Temperature Piezoelectric Sensing", Sensors, vol. 14, No. 1, Jan. 31, 2014, pp. 144-169, XP055267999, DOI: 10.3390/s140100144.

(Continued)

*Primary Examiner* — Derek J Rosenau
(74) *Attorney, Agent, or Firm* — Bejin Bieneman PLC

(57) ABSTRACT

A piezoelectric transducer comprises a piezoelectric element operable to transduce mechanical movement of the piezoelectric element to an electrical signal and to transduce an electrical signal in the piezoelectric element to a mechanical movement thereof, wherein the piezoelectric transducer is operable to transduce above a temperature of 200° C.

17 Claims, 11 Drawing Sheets

(51) Int. Cl.
*G01H 11/08* (2006.01)
*H01L 41/08* (2006.01)

(52) U.S. Cl.
CPC ........... *B06B 1/0681* (2013.01); *G01H 11/08* (2013.01); *H01L 41/0825* (2013.01); *H01L 41/187* (2013.01); *H01L 41/1876* (2013.01)

(58) Field of Classification Search
USPC .................. 310/358; 252/62.9 R, 62.9 PZ
See application file for complete search history.

(56) References Cited

U.S. PATENT DOCUMENTS

| | | | |
|---|---|---|---|
| 2004/0171936 | A1 | 9/2004 | Asada et al. |
| 2006/0006765 | A1* | 1/2006 | Yuk .................... B06B 1/067 310/334 |
| 2006/0071580 | A1* | 4/2006 | Sawada ............ B06B 1/0633 310/369 |
| 2011/0222369 | A1 | 9/2011 | Difoggio et al. |
| 2011/0248603 | A1* | 10/2011 | Tezuka .............. A61B 8/4405 310/314 |
| 2013/0207020 | A1* | 8/2013 | Bell ..................... C04B 35/26 252/62.9 PZ |
| 2015/0061465 | A1* | 3/2015 | Lee ........................ B06B 1/06 310/334 |

FOREIGN PATENT DOCUMENTS

| | | |
|---|---|---|
| JP | S62-225250 A | 10/1987 |
| JP | H06-308104 A | 11/1994 |
| JP | H10-174189 A | 6/1998 |
| JP | 2007007262 A | 1/2007 |
| JP | 2007-289693 A | 11/2007 |
| JP | 2008167548 A | 7/2008 |
| JP | 2013-537513 A | 10/2013 |
| JP | 2014-064629 A | 4/2014 |
| SU | 630243 A1 | 9/1976 |
| WO | 2009042629 A2 | 4/2009 |
| WO | 2012013956 A1 | 2/2012 |
| WO | 2012042215 A1 | 4/2012 |

OTHER PUBLICATIONS

Zhang, Ji et al: "Piezoelectric effects and electromechanical theories at the nanoscale", Nanoscale, vol. 6, No. 22; Jan. 1, 2014, pp. 13314-13327, XP055268020, United Kingdom, ISSN: 2040-3364, DOI: 10.1039/C4NR03756A paragraph [03.3], figure 5.

Fujimoto, Sota et al.: "Characteristic change of sol-gel composites by PZT sol-gel phase in the high temperature environment", Proceedings of Symposium on Ultrasonic Electronics, vol. 35, Dec. 3, 2014, pp. 21-22, XP055268038, paragraph [022].

Krsmanovic, Dalibor: "High temperature ultrasonic gas flow sensor based on lead free piezoelectric material", Nov. 30, 2009, XP055267995, retrieved from the internet: url: https://www.repository.cam.ac.uk/bitstream/handle/1810/245065/DK—High Temperature Piezo V1.20.pdf?sequence=1 [retrieved on Apr. 22, 2016].

International Search Report and Written Opinion for PCT/GB2016/050270 (dated Nov. 7, 2016; 18 pages).

Wei Hu et al.; "BiFeO3—PbZrO3—PbTiO3 ternary system for high Curie temperature piezoceramics", Journal of the European Ceramic Society, vol. 31, No. 5, May 1, 2011, pp. 801-807, XP055214339, ISSN: 0955-2219, DOI: 10.1016/j.jeurceramsoc.2010.11.015.

J. Bennett et al; "Tailoring the structure and piezolectric properties of BiFeO 3—(K 0.5 Bi 0.5) TiO 3—PbTiO 3 ceramics for high temperature applications", Applied Physics Letters, vol. 103, No. 15, Oct. 7, 2013, pp. 152901-152903, XP055609296, US ISSN: 0003-6951, DOI: 10.1063/1.4824652.

European Patent Office Communication Pursuant to Rule 164(2)(b) and Article 94(3) EPC with Search Results for EP Application No. 16704271.2-1003 dated Aug. 7, 2019 (13 pages).

China National Intellectual Property Administration Notification of the Second Office Action for CN Application No. 201680020620.9 dated Sep. 12, 2019 (22 pages; with English translation).

Notice of Reasons for Refusal from JPO for Application No. JP 2017-559925 dated Feb. 18, 2020 (English translation only).

Chinese Patent Office Action for Application No. CN201680020620.9 dated May 22, 2020 (18 pages; with English translation).

Cooper Electric (Shanghai) Co., Ltd; www.docin.com; May 23, 2011 (7 pages).

* cited by examiner

SECTION A-A

PIEZOELECTRIC TRANSDUCERS

CROSS-REFERENCE TO RELATED APPLICATIONS

This application is a national stage of, and claims priority to, Patent Cooperation Treaty Application No. PCT/GB2016/050270 filed on Feb. 5, 2016, which claims priority to Great Britain Application No. GB1501923.5 filed on Feb. 5, 2015 both of which are hereby incorporated by reference in their entirety.

FIELD OF THE DISCLOSURE

This disclosure relates to piezoelectric transducers and to a method of manufacturing piezoelectric transducers, particularly, but not limited to, piezoelectric transducers with an ability to operate effectively at temperatures above at least 200° C., or in other extreme environments such as high pressure, high stress or irradiation.

BACKGROUND OF THE DISCLOSURE

Piezoelectric materials exhibit an electro-mechanical coupling, allowing them to develop an electric charge proportional to an applied mechanical stress in a direct mode. Alternatively, in a converse mode, they can generate a strain from the application of an external electric field. This phenomenon, first discovered in 1880 by J. and P. Curie, is essential to modern devices such as parking sensors, medical ultrasound, fuel injection valves and the ubiquitous piezoelectric buzzer. These and other typical applications span a plethora of industries, but can be categorised as transducers having the following modes of operation; (i) effector, actuator and motor mode for use in speakers, fuel/ink injection, robotics and MEMs; (ii) transducer mode employed in ultrasonic imaging in both medical and SONAR platforms, active vibration dampening, electronic frequency filters and finally; (iii) sensor mode for pickups, microphones and gas lighters. In fact the market space is covered by over 100,000 application patents and valued at >$10 bn annually, and is dominated by sales of transducers used in effector and transducer mode made from lead zirconate titanate (PZT).

PZT contains a high proportion of lead (Pb), an element which is banned in all other electronic applications under the European Union directive Restriction of Hazardous Substances (RoHS). Currently electro-ceramics are exempt, as lead plays a vital role in providing the polarisation required in these materials, but the exemption is often reviewed, and any change would require suppliers and customers to find lead free alternatives.

Principally however, although PZT is effectively exploited in a wide range of markets it is fundamentally limited to applications below ~200° C., above which the stability of its piezoelectric properties decrease steadily.

High temperature electronics is an area of research that has offered materials and design challenges since the 1970's, and has been recognised as a field of significant industrial importance. Currently environments of repeated thermal cycles of 150° C. are now typical, with the requirement for operation at up to 500° C. becoming increasingly necessary in applications such as electronics, including sensors for deep oil drilling, automotive actuator mode transducers for increased operating efficiency, nuclear and other 'clean' energy solutions with extreme environments. The aerospace industry too now requires sensors and effector mode transducers to withstand temperatures exceeding 500° C. for over 100,000 hours in the air and in space to increase efficiency, conduct health monitoring and reduce mass. For example an increase in the operating temperature of a gas turbine by 150° C. removes the necessity for turbine cooling components and can subsequently raise the thermal efficiency by 6%.

The temperature limitations of PZT and other conventional piezoelectric materials can be partially overcome in several ways; however each of these solutions have clear downsides. For example, one can distance the transducer from the high temperature environment by using some intermediary material. However, the sensitivity and bandwidth of the transducer is negatively impacted. Alternatively, one can prevent overheating by either inserting the transducer into the high temperature environment intermittently, or cooling the transducer with a liquid such as water. However, complicated engineering solutions may be required to effectively prevent overheating in this manner. A further possibility is to simply accept that the materials will have a short lifespan in the high temperature environment, but regularly replacing the transducers can be both costly and time consuming. Similar problems exist when employing materials in environments having high radiation or pressure.

Extensive effort has already been made in the development of high temperature transducers employing fibre optics, precious metal strain gauges and piezoelectrics, particularly aimed at surface (SAW) and bulk acoustic wave (BAW) transducers for pressure, mass and chemical measurements. Piezoelectric transducers have been proven to offer excellent resolution, temperature stability, sensitivity and low cost integration properties compared to the other devices for measuring charge, voltage and frequency dependent mechanisms.

The materials used for these applications range in compositions, forms and structures, but importantly aim to have as high a piezoelectric operation temperature above the mainstay PZT system as possible. These include single crystals such as quartz, lithium niobate and gallium orthophosphate, thin films like aluminium nitride and polycrystalline materials, such as bismuth titanate, which are most likely to be used in industrial applications due to their low cost of processing and ease of integration into common electrical devices. These are dominated by bismuth based ceramics as well as including mixed phase systems akin to the mechanism in PZT which provides its premium piezoelectric properties.

Recently, a new piezoelectric ceramic material has been developed which can withstand high temperatures. The material, referred to hereinafter as BF-KBT-PT, is described in International Patent Publication WO2012/013956 A1, the entirety of which is hereby incorporated by reference. Although BF-KBT-PT is able to withstand higher temperatures, conventional piezoelectric transducers cannot be simply modified to include the new material because other components used in the transducers—e.g. the backing material, the casing, the wiring and solder and other elements—are not equipped to withstand the required conditions.

It is an aim of the present disclosure to address at least some of the above difficulties, or other difficulties which will be appreciated from the description below.

SUMMARY OF THE DISCLOSURE

According to the present disclosure there is provided an apparatus and method as set forth in the appended claims.

Other features of the disclosure will be apparent from the dependent claims, and the description which follows.

According to a first aspect of the present disclosure there is provided a piezoelectric transducer having a piezoelectric element operable to transduce mechanical movement of the piezoelectric element to an electrical signal and to transduce an electrical signal in the piezoelectric element to a mechanical movement thereof, wherein the piezoelectric transducer is operable to transduce above a temperature of 200° C.

The piezoelectric transducer may be operable to transduce at temperatures at or above 210° C. The piezoelectric transducer may be operable to transduce at temperatures at or above 215° C. The piezoelectric transducer may be operable to transduce at temperatures at or above 220° C. The piezoelectric transducer may be operable to transduce at temperatures at or above 225° C. The piezoelectric transducer may be operable to transduce at temperatures at or above 230° C. The piezoelectric transducer may be operable to transduce at temperatures at or above 235° C. The piezoelectric transducer may be operable to transduce at temperatures at or above 240° C. The piezoelectric transducer may be operable to transduce at temperatures at or above 245° C. The piezoelectric transducer may be operable to transduce at temperatures at or above 250° C. The piezoelectric transducer may be operable to transduce at temperatures at or above 270° C. The piezoelectric transducer may be operable to transduce at temperatures at or above 280° C. The piezoelectric transducer may be operable to transduce at temperatures at or above 290° C. The piezoelectric transducer may be operable to transduce at temperatures at or above 300° C. The piezoelectric transducer may be operable to transduce at temperatures at or above 310° C. The piezoelectric transducer may be operable to transduce at temperatures at or above 320° C. The piezoelectric transducer may be operable to transduce at temperatures at or above 330° C. The piezoelectric transducer may be operable to transduce at temperatures at or above 340° C. The piezoelectric transducer may be operable to transduce at temperatures at or above 350° C. The piezoelectric transducer may be operable to transduce at temperatures at or above 360° C. The piezoelectric transducer may be operable to transduce at temperatures at or above 370° C. The piezoelectric transducer may be operable to transduce at temperatures at or above 380° C. The piezoelectric transducer may be operable to transduce at temperatures at or above 390° C. The piezoelectric transducer may be operable to transduce at temperatures at or above 400° C. The piezoelectric transducer may be operable to transduce at temperatures at or above 410° C. The piezoelectric transducer may be operable to transduce at temperatures at or above 420° C. The piezoelectric transducer may be operable to transduce at temperatures at or above 430° C. The piezoelectric transducer may be operable to transduce at temperatures at or above 440° C. The piezoelectric transducer may be operable to transduce at temperatures at or above 450° C. The piezoelectric transducer may be operable to transduce at temperatures at or above 460° C. The piezoelectric transducer may be operable to transduce at temperatures at or above 470° C. The piezoelectric transducer may be operable to transduce at temperatures at or above 480° C. The piezoelectric transducer may be operable to transduce at temperatures at or above 490° C. The piezoelectric transducer may be operable to transduce at temperatures at or above 500° C. The piezoelectric transducer may be operable to transduce at temperatures at or above 510° C. The piezoelectric transducer may be operable to transduce at temperatures at or above 520° C. The piezoelectric transducer may be operable to transduce at temperatures at or above 530° C. The piezoelectric transducer may be operable to transduce at temperatures at or above 540° C. The piezoelectric transducer may be operable to transduce at temperatures at or above 550° C. The piezoelectric transducer may be operable to transduce at temperatures at or above 560° C. The piezoelectric transducer may be operable to transduce at temperatures at or above 570° C. The piezoelectric transducer may be operable to transduce at temperatures at or above 580° C. The piezoelectric transducer may be operable to transduce at temperatures at or above 590° C. The piezoelectric transducer may be operable to transduce at temperatures at or above 600° C. The piezoelectric transducer may be operable to transduce at temperatures at or above 610° C. The piezoelectric transducer may be operable to transduce at temperatures at or above 620° C. The piezoelectric transducer may be operable to transduce at temperatures at or above 630° C. The piezoelectric transducer may be operable to transduce at temperatures at or above 640° C. The piezoelectric transducer may be operable to transduce at temperatures at or above 650° C. The piezoelectric transducer may be operable to transduce at temperatures at or above 660° C.

The piezoelectric transducer may be operable to transduce at temperatures at or below 660° C. The piezoelectric transducer may be operable to transduce at temperatures at or below 650° C. The piezoelectric transducer may be operable to transduce at temperatures at or below 640° C. The piezoelectric transducer may be operable to transduce at temperatures at or below 630° C. The piezoelectric transducer may be operable to transduce at temperatures at or below 620° C. The piezoelectric transducer may be operable to transduce at temperatures at or below 610° C. The piezoelectric transducer may be operable to transduce at temperatures at or below 600° C. The piezoelectric transducer may be operable to transduce at temperatures at or below 590° C. The piezoelectric transducer may be operable to transduce at temperatures at or below 580° C. The piezoelectric transducer may be operable to transduce at temperatures at or below 570° C. The piezoelectric transducer may be operable to transduce at temperatures at or below 560° C. The piezoelectric transducer may be operable to transduce at temperatures at or below 550° C. The piezoelectric transducer may be operable to transduce at temperatures at or below 540° C. The piezoelectric transducer may be operable to transduce at temperatures at or below 530° C. The piezoelectric transducer may be operable to transduce at temperatures at or below 520° C. The piezoelectric transducer may be operable to transduce at temperatures at or below 510° C. The piezoelectric transducer may be operable to transduce at temperatures at or below 500° C. The piezoelectric transducer may be operable to transduce at temperatures at or below 490° C. The piezoelectric transducer may be operable to transduce at temperatures at or below 480° C. The piezoelectric transducer may be operable to transduce at temperatures at or below 470° C. The piezoelectric transducer may be operable to transduce at temperatures at or below 460° C. The piezoelectric transducer may be operable to transduce at temperatures at or below 450° C. The piezoelectric transducer may be operable to transduce at temperatures at or below 440° C. The piezoelectric transducer may be operable to transduce at temperatures at or below 430° C. The piezoelectric transducer may be operable to transduce at temperatures at or below 420° C. The piezoelectric transducer may be operable to transduce at temperatures at or below 410° C. The piezoelectric transducer may be operable to transduce at temperatures at or below 400° C.

The piezoelectric transducer may be operable to transduce in a range between two of the values given above.

The transducing function of the piezoelectric transducer may be a functional transducing, which may be a transducing activity of at least 20 $d_{33}$ pm $N^{-1}$, preferably at least 22 $d_{33}$ pm $N^{-1}$, preferably at least 24 $d_{33}$ pm $N^{-1}$, preferably at least 26 $d_{33}$ pm $N^{-1}$, preferably at least 28 $d_{33}$ pm $N^{-1}$, preferably at least 30 $d_{33}$ pm $N^{-1}$, preferably at least 35 $d_{33}$ pm $N^{-1}$, preferably at least 40 $d_{33}$ pm $N^{-1}$, preferably at least 45 $d_{33}$ pm $N^{-1}$, preferably at least 50 $d_{33}$ pm $N^{-1}$, preferably at least 60 $d_{33}$ pm $N^{-1}$, preferably at least 70 $d_{33}$ pm $N^{-1}$, preferably at least 80 $d_{33}$ pm $N^{-1}$, preferably at least 90 $d_{33}$ pm $N^{-1}$, preferably at least 100 $d_{33}$ pm $N^{-1}$, preferably at least 150 $d_{33}$ pm $N^{-1}$, preferably at least 200 $d_{33}$ pm $N^{-1}$, where $d_{33}$ is the piezoelectric charge coefficient, pm is $10^{-12}$ m and N is stress force in Newtons, preferably for a sample of piezoelectric material at room temperature, but which has previously been heated to at least 380° C. for 1 hour, or a sample of piezoelectric material at room temperature, but which has previously been heated to at least 400° C. for 1 hour, or a sample of piezoelectric material at room temperature, but which has previously been heated to at least 420° C. for 1 hour, or a sample of piezoelectric material at room temperature, but which has previously been heated to at least 440° C. for 1 hour.

The transducing function of the piezoelectric transducer may be a transducing activity of up to approximately 100 $d_{33}$ pm $N^{-1}$, preferably up to approximately 110 $d_{33}$ pm $N^{-1}$, preferably up to approximately 120 $d_{33}$ pm $N^{-1}$, preferably up to approximately 130 $d_{33}$ pm $N^{-1}$, preferably up to approximately 140 $d_{33}$ pm $N^{-1}$, preferably up to approximately 150 $d_{33}$ pm $N^{-1}$, preferably up to approximately 160 $d_{33}$ pm $N^{-1}$, preferably up to approximately 170 $d_{33}$ pm $N^{-1}$, preferably up to approximately 180 $d_{33}$ pm $N^{-1}$, preferably up to approximately 190 $d_{33}$ pm $N^{-1}$, preferably up to approximately 200 $d_{33}$ pm $N^{-1}$, preferably for a sample of piezoelectric material at room temperature, but which has previously been heated to at least 380° C. for 1 hour, or a sample of piezoelectric material at room temperature, but which has previously been heated to at least 400° C. for 1 hour, or a sample of piezoelectric material at room temperature, but which has previously been heated to at least 420° C. for 1 hour, or a sample of piezoelectric material at room temperature, but which has previously been heated to at least 440° C. for 1 hour.

The transducing may be a transducing activity in a range between two of the values given above. The transducing activity of the piezoelectric material may be substantially larger when the piezoelectric material is at a temperature exceeding 200° C., compared to the transducing activity of the piezoelectric material when it is at room temperature (25° C.).

The piezoelectric transducer may be operable to transduce an electrical signal with a variety of modes. The electrical signal may be a single ultrasonic pulse, or a train of successive pulses. The pulse may be unipolar, or bi-polar, the choice of bi-polar of unipolar may be made depending on whether there is an intention to increase energy insertion or to reduce ringing. To further increase acoustic energy insertion, other modes may be applied. Formed unipolar (DC) or bi-polar (AC) electrical signals may be applied. The electrical signals may be applied continuously and/or sweeping in amplitude and/or frequency. The mode may be a continuous sine wave, or more preferably a swept signal such as a 'chirp.'

The transducer may be operable to respond to and/or transduce multiple frequencies. The transducer may incorporate more than one piezoelectric element. The transducer may incorporate a single piezoelectric element, which, in use, may be excited at different frequencies by an electrical stimulus. The piezoelectric element may, in use, be excited at two or more resonant modes. The mode may be the thickness and planar/radial mode.

The piezoelectric transducer may be operable to transduce an electrical signal having a voltage at or above 10 volts. The piezoelectric transducer may be operable to transduce an electrical signal having a voltage at or above 12 volts. The piezoelectric transducer may be operable to transduce an electrical signal having a voltage at or above 24 volts. The piezoelectric transducer may be operable to transduce an electrical signal having a voltage at or above 30 volts. The piezoelectric transducer may be operable to transduce an electrical signal having a voltage at or above 40 volts. The piezoelectric transducer may be operable to transduce an electrical signal having a voltage at or above 50 volts. The piezoelectric transducer may be operable to transduce an electrical signal having a voltage at or above 60 volts. The piezoelectric transducer may be operable to transduce an electrical signal having a voltage at or above 70 volts. The piezoelectric transducer may be operable to transduce an electrical signal having a voltage at or above 80 volts. The piezoelectric transducer may be operable to transduce an electrical signal having a voltage at or above 90 volts. The piezoelectric transducer may be operable to transduce an electrical signal having a voltage at or above 100 volts. The piezoelectric transducer may be operable to transduce an electrical signal having a voltage at or above 150 volts. The piezoelectric transducer may be operable to transduce an electrical signal having a voltage at or above 200 volts. The piezoelectric transducer may be operable to transduce an electrical signal having a voltage at or above 250 volts. The piezoelectric transducer may be operable to transduce an electrical signal having a voltage at or above 300 volts.

The piezoelectric transducer may be operable to transduce an electrical signal having a voltage at or below 500 volts. The piezoelectric transducer may be operable to transduce an electrical signal having a voltage at or below 400 volts. The piezoelectric transducer may be operable to transduce an electrical signal having a voltage at or below 300 volts. The piezoelectric transducer may be operable to transduce an electrical signal having a voltage at or below 200 volts. The piezoelectric transducer may be operable to transduce an electrical signal having a voltage at or below 150 volts. The piezoelectric transducer may be operable to transduce an electrical signal having a voltage at or below 140 volts. The piezoelectric transducer may be operable to transduce an electrical signal having a voltage at or below 130 volts. The piezoelectric transducer may be operable to transduce an electrical signal having a voltage at or below 120 volts. The piezoelectric transducer may be operable to transduce an electrical signal having a voltage at or below 110 volts. The piezoelectric transducer may be operable to transduce an electrical signal having a voltage at or below 100 volts. The piezoelectric transducer may be operable to transduce an electrical signal having a voltage at or below 90 volts. The piezoelectric transducer may be operable to transduce an electrical signal having a voltage at or below 80 volts. The piezoelectric transducer may be operable to transduce an electrical signal having a voltage at or below 70 volts.

The piezoelectric transducer may be operable to transduce an electrical signal having a voltage at or below 60 volts. The piezoelectric transducer may be operable to transduce an electrical signal having a voltage at or below 50 volts. The piezoelectric transducer may be operable to transduce an electrical signal having a voltage at or below 30 volts. The piezoelectric transducer may be operable to transduce an electrical signal having a voltage at or below 24 volts. The piezoelectric transducer may be operable to transduce an electrical signal having a voltage at or below 12 volts. The piezoelectric transducer may be operable to transduce an electrical signal having a voltage at or below 3.2 volts.

The piezoelectric transducer may be operable to transduce an electrical signal having a voltage with a period at or above 80 nanoseconds. The piezoelectric transducer may be operable to transduce an electrical signal having a voltage with a period at or above 100 nanoseconds. The piezoelectric transducer may be operable to transduce an electrical signal having a voltage with a period at or above 120 nanoseconds.

The piezoelectric transducer may be operable to transduce with an electrical signal having a frequency at or above 1 kHz. The piezoelectric transducer may be operable to transduce an electrical signal having a frequency at or above 10 kHz. The piezoelectric transducer may be operable to transduce an electrical signal having a frequency at or above 100 kHz. The piezoelectric transducer may be operable to transduce an electrical signal having a frequency at or above 1 MHz. The piezoelectric transducer may be operable to transduce an electrical signal having a frequency at or above 2 MHz. The piezoelectric transducer may be operable to transduce an electrical signal having a frequency at or above 3 MHz. The piezoelectric transducer may be operable to transduce an electrical signal having a frequency at or above 4 MHz. The piezoelectric transducer may be operable to transduce an electrical signal having a frequency at or above 5 MHz. The piezoelectric transducer may be operable to transduce an electrical signal having a frequency at or above 10 MHz.

The piezoelectric transducer may be adapted to detect a gas fraction in a liquid at a temperature between −55 C and 600 C. The piezoelectric transducer may be adapted to detect a gas fraction in a liquid at a temperature between −55 C and 500 C. The piezoelectric transducer may be adapted to detect a gas fraction in a liquid at a temperature between −55 C and 400 C. The piezoelectric transducer may be adapted to detect a gas fraction in a liquid at a temperature between −55 C and 390 C. The piezoelectric transducer may be adapted to detect a gas fraction in a liquid at a temperature between −55 C and 380 C. The piezoelectric transducer may be adapted to detect a gas fraction in a liquid at a temperature between −55 C and 370 C. The piezoelectric transducer may be adapted to detect a gas fraction in a liquid at a temperature between −55 C and 360 C.

Elements of the piezoelectric transducer may be secured together with mechanical fixing means, which may be reversible mechanical fixing means. The mechanical fixing means may be threaded fasteners, which may include cooperating threads of elements of the piezoelectric transducer.

Advantageously, the piezoelectric transducer does not require elements of the transducer to be secured together with adhesive or solder.

The piezoelectric transducer may include an effector, which is preferably operable to detect movement of a target. The effector here may be a piece of the transducer that is moved by the target and causes the piezoelectric element to generate a current, rather than an element caused to move by a current supplied to the piezoelectric element. The effector may be in contact with the piezoelectric element. The piezoelectric transducer may be a flow transducer.

The piezoelectric transducer may be a rangefinding transducer. The piezoelectric transducer may be operable to transmit and receive vibration signals, preferably the piezoelectric element is operable to transmit and receive vibration signals. The vibration signals may be used for SONAR location.

The piezoelectric transducer may be a directional transducer, preferably having a target direction, preferably along a longitudinal axis of the piezoelectric transducer. The piezoelectric transducer may have a backing material, preferably adjacent to the piezoelectric element. The backing material may be located rearward of the target direction with respect to the piezoelectric element. The backing material is preferably adapted to absorb or scatter vibration signals rearward of the target direction with respect to the piezoelectric element. The backing material may be adapted to adhere to the piezoelectric element. The backing material may be adapted to encapsulate the piezoelectric element. The backing material may be similar in acoustic properties to the matching layer. The backing material may be acoustically active. The backing material may be acoustically inactive.

The backing material may have an acoustic impedance substantially of the same order as that of the piezoelectric material, which may allow energy moving rearwards from the target direction passed the piezoelectric material to be absorbed by the backing material. Preferably, the backing material should scatter the energy, for example, by being a composite or made of two materials, or being inhomogeneous, or being of irregular shape.

The backing material may be a mixture of tungsten or other heavy metal (such as tantalum) with a castable ceramic and or glass.

The backing material may include one or more of mullite, cordierite, alumina-silicate, ceramic with inhomogeneous structure, or internal porosity. The backing material may have cylindrical shape, which may be core-drilled.

The backing material may be metal foam or may be a porous sintered metal body. Preferably the porous metal backing material has a matching, preferably closely matching, acoustic impedance to the piezoelectric (25 to 30 MRayls). Preferably the porous metal backing material has porosity at or below 20% void volume in the metal matrix. One form may be a substantially titanium alloy foam, or a sintered substantially copper alloy.

The backing material may be a solid body, where the body is dense and uniform, but scattering occurs as a result of post-processed features, which may be holes, castling, and/or grooves. The scattering may occur due to these features. The backing material may be a solid body where the body may be porous and may be graduated in density and/or may be graduated in porosity.

Additionally, the backing material may be electrically conductive or may be electrically resistive. Additionally the backing material may work for short or long periods of time above 400° C.

The backing material may be formable in a liquid phase thereof, preferably being subsequently cured, or may be solidified when in situ in the piezoelectric sensor. The backing material may be cut or formed from a solid body.

The backing material may be bonded to the piezoelectric element. The bonding may be by means of a conducting adhesive, such as a silver adhesive. The bonding may be by means of dry coupling. The bonding may be by means of diffusion bonding, vacuum brazing etc. The bonding may be by means of heat and pressure to form the bond. The bonding may be by means of multiple layers of material, which may be different materials, which may be different materials in different layers. The bonding may be by means of high temperature glass, which may be by use of heat and stress to generate the bond.

The backing material may be the same material as the piezoelectric material. This backing material may be poled, unpoled, or partially poled. There may be an intermediate layer between the piezoelectric material and the backing material. Preferably, if the backing material is the same material as the piezoelectric element, the backing material may be porous, preferably having an internal porosity. A level of porosity may vary throughout the backing material, for example, porosity may increase away from the interface with the piezoelectric material.

The piezoelectric element may be a regular shape in plan. The piezoelectric element may be an irregular shape in plan. The piezoelectric element may be circular in plan. The piezoelectric element may be square in plan. The piezoelectric element may be rectangular in plan. The piezoelectric element may be toroidal. The piezoelectric element may be cylindrical.

According to another aspect of the present disclosure there is provided a kit of parts for a piezoelectric transducer, the kit of parts comprising a housing, an effector, a piezoelectric element and electrical contacting means.

The kit may further include an electrode plate.

The kit may further include an isolator. The kit may further include a cap.

According to another aspect of the present disclosure there is provided a kit of parts for a piezoelectric transducer, the kit of parts comprising a housing, a wear plate, a piezoelectric element and electrical contacting means.

The piezoelectric material may be a ceramic comprising (eg consisting essentially of or consisting of) a solid solution of formula:

$$x(Bi_aK_{1-a})TiO_3\text{-}yBiFeO_3\text{-}zPbTiO_3$$

wherein $0.4 \leq a \leq 0.6$;
$0 < x < 1$;
$0 < y < 1$;
$0 \leq z \leq 0.5$; and
$x+y+z=1$,
wherein the ceramic is substantially free of non-perovskite phases, other than porosity.

The ceramic may advantageously exhibit a Curie point in excess of 350° C. The ceramic may advantageously exhibit a Curie point in excess of 400° C. The ceramic may advantageously exhibit a Curie point in excess of 450° C. The ceramic may advantageously exhibit a Curie point in excess of 500° C. The ceramic may advantageously exhibit a Curie point in excess of 550° C. The ceramic may advantageously exhibit a Curie point in excess of 600° C. The ceramic may advantageously exhibit a Curie point in excess of 650° C. The ceramic may advantageously exhibit a Curie point in excess of 700° C.

Preferably the ceramic consists essentially of a solid solution. For example, the solid solution may be present in the ceramic in an amount of 50 wt % or more (eg in the range 50 to 99 wt %), preferably 75 wt % or more, particularly preferably 90 wt % or more, more preferably 95 wt % or more.

Preferably the ceramic further comprises one or more perovskite phases. Particularly preferably the (or each) perovskite phase is selected from the group consisting of $(Bi_aK_{1-a})TiO_3$, $BiTiO_3$, $KTiO_3$, $BiFeO_3$ and $PbTiO_3$. The (or each) perovskite phase may be present in an amount of 75 wt % or less, preferably 50 wt % or less, particularly preferably 25 wt % or less, more preferably 5 wt % or less. The (or each) perovskite phase may be present in a trace amount.

The non-perovskite phases may be mixed metal phases of two or more (eg three) of Bi, K, Ti, Fe or Pb. Examples include $Bi_2O_3$, $K_2O$, $Bi_2Fe_4O_9$ and $Bi_3Ti_4O_{12}$.

The amount of non-perovskite phases present in the ceramic may be such that the phases are non-discernible in an X-ray diffraction pattern. The amount of non-perovskite phases present in the ceramic may be a trace amount.

Preferably the total amount of non-perovskite phases present in the ceramic is less than 10 wt %, particularly preferably less than 8 wt %, more preferably less than 5 wt %, yet more preferably less than 2 wt %, still yet more preferably less than 1 wt %, most preferably less than 0.1 wt %.

The solid solution may be a partial solid solution. Preferably the solid solution is a complete solid solution.

The solid solution may be substantially monophasic.

The solid solution may be biphasic. Preferably the solid solution has two of the group consisting of a rhombohedral phase, a monoclinic phase, an orthorhombic phase and a tetragonal phase. The solid solution may have a rhombohedral phase and a monoclinic phase. The solid solution may have a rhombohedral phase and orthorhombic phase. Preferably the solid solution has a tetragonal phase and a rhombohedral phase.

Preferably $0 \leq z \leq 0.3$.

z may be greater than. Preferably in this embodiment the ceramic comprises (eg consists essentially of or consists of) a solid solution of formula:

$$x(Bi_aK_{1-a})TiO_3\text{-}(1\text{-}x)BiFeO_3$$

wherein a is in the range 0.4 to 0.6 and x is in the range 0.01 to 0.99, wherein the ceramic is substantially free of non-perovskite phases.

The solid solution may be a solid solution of $(Bi_aK_{1-a})TiO_3$ in $BiFeO_3$. The solid solution may be a solid solution of $BiFeO_3$ in $(Bi_aK_{1-a})TiO_3$.

Preferably x is in the range 0.1 to 0.9

Particularly preferably x is in the range 0.7 to 0.9. preferred particular example in this range is a biphasic solid solution of a tetragonal and rhombohedral phase.

Particularly preferably x is in the range 0.1 to 0.4. The ceramics in this range exhibit a surprisingly high Curie point and are potentially useful in high temperature environments.

Particularly preferably x is in the range 0.5 to 0.6.

Preferably a is in the range 0.45 to 0.55. Particularly preferably a is in the range 0.48 to 0.52. More preferably a is 0.50.

In the solid solution, one or more of Bi, K, Fe and Ti may be substituted by a metal dopant. The metal dopant for each substitution may be the same or different. The presence of a metal dopant may significantly and unpredictably impact on the properties of the solid solution. For example, there may be an improvement in the Curie point and/or the piezoelectric activity.

The (or each) metal dopant may be present in an amount up to 50 at %, preferably up to 20 at %, particularly preferably up to 10 at %, more particularly preferably up to 5 at %, yet more preferably up to 3 at %, most preferably up to 1 at %.

The metal dopant may be an A-site metal dopant. For example, the A-site metal dopant may substitute Bi and/or K and/or Pb. Preferably the A-site metal dopant is selected from the group consisting of Li, Na, Ca, Sr, Ba and a rare earth metal.

The metal dopant may be a B-site metal dopant. For example, the B-site metal dopant may substitute Fe and/or Ti.

A preferred A-site metal dopant is Li or Na. The substitution of Li or Na on the A-site may modify (eg increase) the Curie point and/or favourably shift the phase composition of any biphasic solid solution (eg rhombohedral-tetragonal solid solution).

A preferred A-site metal dopant is Ca, Sr or Ba. The substitution of Ca, Sr or Ba on the A-site may reduce dielectric loss, modify (eg increase) the Curie point and/or favourably shift the phase composition of any biphasic solid solution (eg rhombohedral-tetragonal solid solution).

A preferred A-site metal dopant is a rare earth metal. A particularly preferred A-site metal dopant is La or Nd. Typically La or Nd substitute K. Substitution by La or Nd may increase the piezoelectric activity at the expense of the Curie point. By way of example (for a given $BiFeO_3$ concentration), substitution by La and Nd would typically reduce the Curie point by about 100-200° C. and increase the piezoelectric activity by 50%.

In one embodiment, the A-site metal dopant is La (eg $La^{3+}$) which substitutes K (ie $K^+$). This substitution may improve significantly the resistivity.

A preferred B-site metal dopant has a higher valency than the valency of the metal which it substitutes. Conductivity in perovskites is usually attributable to electron holes or oxygen vacancies. Substituting a higher valence metal dopant onto a B-site may enhance appreciably the resistivity (ie suppress the conductivity).

In one embodiment, the B-site metal dopant has a valency in the range IV to VII. More particularly preferred is a B-site metal dopant selected from the group consisting of Ti, Zr, W, Nb, V, Ta, Mo and Mn. Yet more particularly preferred is a B-site metal dopant selected from the group consisting of Nb, Ta, Mo, W, Zr and V.

A preferred B-site metal dopant is selected from the group consisting of Ti, Fe, Co and Ni. Particularly preferred is Ti (eg $Ti^{4+}$) which substitutes Fe (ie $Fe^{3+}$).

In one embodiment, the B-site metal dopant has a mixed valency. Substituting a mixed valency metal dopant onto a B-site may improve the resistivity significantly.

In one embodiment, the B-site metal dopant is Mn. An advantage of Mn is that it behaves as a buffer in the sense that it can adopt a range of oxidation states which can improve resistivity in a range of ceramics.

In one embodiment, the B-site metal dopant is Co. Typically Co substitutes Fe (ie $Fe^{3+}$).

The ceramic may take the form of a textured ceramic, a single crystal, a thin film or a composite (eg a ceramic/glass or ceramic/polymer composite).

Preferably the Curie point of the ceramic is 350° C. or more. The Curie point of the ceramic may be 400° C. or more. The Curie point of the ceramic may be 450° C. or more. The Curie point of the ceramic may be 500° C. or more. The Curie point of the ceramic may be 550° C. or more. The Curie point of the ceramic may be 600° C. or more. The Curie point of the ceramic may be 650° C. or more. The Curie point of the ceramic may be 700° C. or more.

Preferably the ceramic has an X-ray diffraction pattern substantially as illustrated in FIG. 2 or 7.

The ceramic may be obtainable by sintering a sinterable form of a mixed metal oxide containing Bi, K, Fe and Ti (and optionally Pb) to produce the ceramic.

Preferably the ceramic further comprises a pre-sintering additive.

The pre-sintering additive may be present in an amount of 75 wt % or less, preferably 50 wt % or less, particularly preferably 25 wt % or less, more preferably 5 wt % or less. The pre-sintering additive may be present in a trace amount.

The pre-sintering additive may be a perovskite. The pre-sintering additive may be a layered perovskite such as $Bi_4Ti_3O_{12}$. The pre-sintering additive may be a lead-containing perovskite. The lead-containing perovskite may be $PbTiO_3$ or $PbZrO_3$.

The pre-sintering additive may be added post-reaction (eg post-calcination) to form the mixed metal oxide containing Bi, K, Fe and Ti (and optionally Pb). The pre-sintering additive may serve as a sintering aid.

In one embodiment, the ceramic is obtainable by a process comprising:
 (A) preparing an intimate mixture of a substantially stoichiometric amount of a compound of each of Bi, K, Ti and Fe (and optionally Pb);
 (B) converting the intimate mixture into an intimate powder;
 (C) inducing a reaction in the intimate powder to produce a mixed metal oxide;
 (D) manipulating the mixed metal oxide into a sinterable form; and
 (E) sintering the sinterable form of the mixed metal oxide to produce the ceramic.

Viewed from a yet further aspect the present disclosure provides a process for preparing a ceramic as hereinbefore defined comprising:
 (A) preparing an intimate mixture of a substantially stoichiometric amount of a compound of each of Bi, K, Ti and Fe (and optionally Pb);
 (B) converting the intimate mixture into an intimate powder;
 (C) inducing a reaction in the intimate powder to produce a mixed metal oxide;
 (D) manipulating the mixed metal oxide into a sinterable form; and
 (E) sintering the sinterable form of the mixed metal oxide to produce the ceramic.

In step (A), it may be advantageous for one or more of the compounds of Fe, Ti, K and Bi (and optionally Pb) to depart from a stoichiometric amount. For example, one or more of Fe, Ti, K and Bi (and optionally Pb) is present in excess of the stoichiometric amount. For example, the atomic % may depart from stoichiometry by ±20% or less, preferably ±10% or less, particularly preferably ±5% or less. By departing from stoichiometry, the ceramic may be equipped advantageously with useful oxide phases (eg perovskite phases).

Preferably in step (A) the substantially stoichiometric amount of the compound of each of Bi, K, Ti and Fe (and optionally Pb) is expressed by the compositional formula:

$$x(Bi_bK_c)TiO_3\text{-}y(BiFe_{1-d}B_dO_3)\text{-}zPbTiO_3$$

wherein:
 B is a B-site metal dopant as defined hereinbefore;
 b is in the range 0.4 to 0.6;
 c is in the range 0.4 to 0.6;
 d is in the range 0 to 0.5; and
 x, y and z are as hereinbefore defined.
 In one embodiment, B is Ti.
 In one embodiment, B is Co.

In one embodiment, d is in the range 0 to 0.2. More preferably d is zero.

In one embodiment, z is zero.

In one embodiment, b is a as hereinbefore defined and c is (1-a).

Step (A) may include a metal dopant oxide which delivers a metal dopant as hereinbefore defined.

The compound of each of Bi, K, Ti and Fe (and optionally Pb) may be independently selected from the group consisting of an oxide, nitrate, hydroxide, hydrogen carbonate, isopropoxide, polymer and carbonate, for example, an oxide and carbonate. Examples are $Bi_2O_3$ and $K_2CO_3$.

The intimate mixture may be a slurry (eg a milled slurry), a solution (eg an aqueous solution), a suspension, a dispersion, a sol-gel or a molten flux.

Step (C) may include heating (eg calcining). Preferably step (C) includes stepwise or interval heating. Step (C) may include stepwise or interval cooling.

Where the intimate mixture is a solution, the compound may be a salt (eg a nitrate).

Where the intimate mixture is a sol-gel, the compound may be an isopropoxide.

Where the intimate mixture is a molten flux, the compound may be an oxide dissolved in a salt flux. The mixed metal oxide from step (C) may be precipitated out on cooling.

Preferably the intimate powder is a milled powder. Step (A) may be:
- (A1) preparing a slurry of a substantially stoichiometric amount of a compound of each of Bi, K, Ti and K (and optionally Pb);
- (A2) milling the slurry;

and step (B) may be
- (BI) drying the slurry to produce the milled powder.

Step (E) may be stepwise or interval sintering. Preferably step (E) includes stepwise or interval heating and stepwise or interval cooling.

Step (E) may be carried out in the presence of a sintering aid. The presence of a sintering aid promotes densification. The sintering aid may be $CuO_2$.

Step (D) may include milling the mixed metal oxide. Step (D) may include pelletising the mixed metal oxide.

Step (D) may include suspending the mixed metal oxide in an organic solvent. Step (D) may include painting, spraying or printing the mixed metal oxide suspension to prepare for sintering.

Viewed from a still yet further aspect the present disclosure provides the use of a ceramic as hereinbefore defined in a piezoelectric device.

Preferably in the use according to the disclosure the piezoelectric device is operable at a temperature in excess of 200° C.

The piezoelectric device may be a piezoelectric transducer operable in an actuator, sensor or transformer mode. For example the piezoelectric device may be an industrial steam sensor.

BRIEF DESCRIPTION OF THE DRAWINGS

For a better understanding of the disclosure, and to show how embodiments of the same may be carried into effect, reference will now be made, by way of example, to the accompanying diagrammatic drawings in which:

FIG. 1a is a schematic exploded side view of a piezoelectric transducer;

FIG. 1b is a schematic exploded perspective view of the piezoelectric transducer of FIG. 1a;

FIG. 3b is schematic assembled side view of the piezoelectric transducer shown in FIG. 3a;

DETAILED DESCRIPTION OF THE EXAMPLE EMBODIMENTS

Figures 1A, 1B:
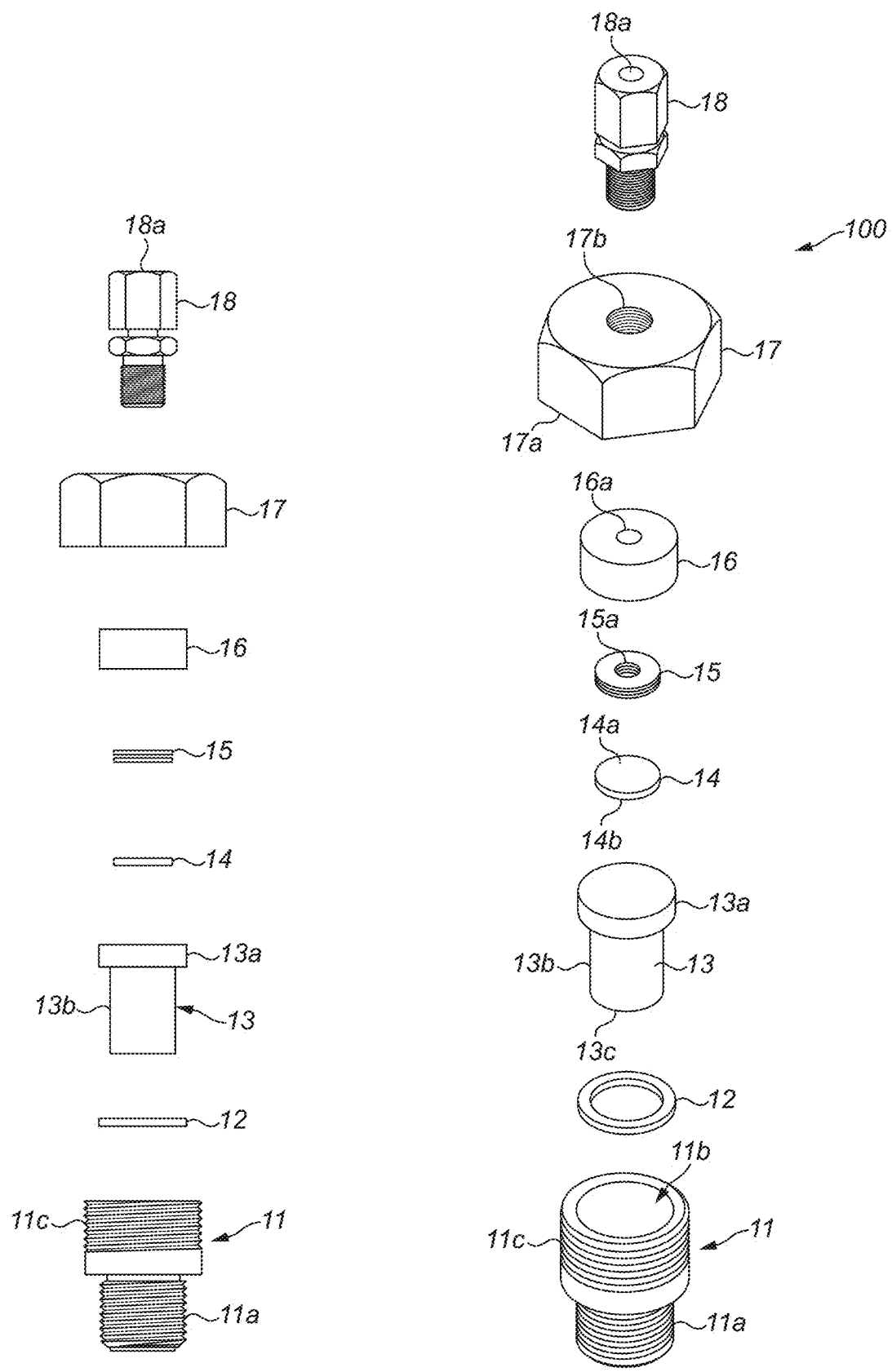

FIG. 1 shows an exploded view of a piezoelectric transducer device 100 in accordance with a first example embodiment of the disclosure. The piezoelectric transducer device 100 is configured to sense vibrations in a high temperature environment.

The transducer 100 comprises a housing 11, a washer 12, an effector 13, a piezoelectric element 14, an electrode plate 15, an isolator 16 and a cap 17.

The housing 11 retains the other elements of the transducer 100 whilst in use. In one example, the housing 11 is manufactured from stainless steel. The stainless steel may particularly be type 304 or 316 stainless steel or alternatively titanium or a nickel alloy.

The housing 11 comprises, for example, a threaded portion 11a which facilitates, for example, mounting to a pipe containing high temperature fluids when in use. Advantageously, the dimensions of the housing 11 are such that the assembled transducer 100 can be inserted into standard pipe clamps or mountings, or a welded stub.

The housing 11 also comprises a recessed portion 11b in which to receive the washer 12 and effector 13 etc. An upper portion 11c is externally threaded to receive the cap 17, which is described below.

The effector 13 comprises an upper portion 13a and a lower portion 13b. Both lower and upper portions 13a,b are substantially cylindrical in profile. The diameter of the upper portion 13a is such that it cannot pass through the recessed portion 11b in the housing 11, and is thus retained in the housing 11. Conversely, the diameter of the lower portion 13b is such that it can extend into the recessed portion 11b and protrude from a lower end of the housing 11.

A bottom surface 13c of the effector 13 comprises a threaded cavity (not shown), configured to receive a contact pin (not shown).

A top surface of the effector 13 may comprises a circular recess configured to receive the piezoelectric element 14.

The washer 12 is disposed in the recessed portion 11b, between the housing 11 and the effector 13. The washer has a diameter which substantially corresponds to the diameter of the recessed portion 11b, and comprises an aperture sized to allow the lower portion 13b of the effector 13 to pass therethrough. Consequently, the washer 12 seals the housing 11, protecting the elements of the housing 11 from the high temperature environment.

In one example, the washer 12 is made from a high temperature polymer, which may be for example polyimide. In a further example, the washer is made from metal, which may be for example copper. In a further example, the washer is made from ceramic, which may be for example alumina. In further examples, the washer 12 can be omitted from the transducer.

The piezoelectric element 14 comprises BF-KBT-PT, as described in WO2012/013956 A1. An upper electrode 14a is formed on an upper surface of the piezoelectric element 14 and a lower electrode 14b is formed on a lower surface of the piezoelectric element 14. In one example, the electrodes 14a,b include a high temperature silver coating, such as a fired on paint. In a further example, the electrodes 14a,b include magnetron sputtered metal, such as gold. The electrodes must have the properties of (a) good adhesion to the isolator 16, (b) high temperature operation, (c) corrosion resistance, and (d) electrical conductivity. This is widely used for both PZT, other transducers, and making tracks on alumina for example switches.

The electrode plate 15 is formed of a conductive material, and is configured to be placed in electrical contact with the upper and lower electrode 14a,b. The lower electrode 14b includes a tab (not shown) that extends around an edge of the piezoelectric element 14 to the upper side to allow connection to the electrode plate 15. The tab is suitably isolated from the upper electrode to prevent a short circuit. The electrode plate 15 comprises a receiving portion 15a configured to receive an electrical cable (not shown). In one example, the electrical cable is mechanically clamped to the electrode plate 15. Once the transducer 100 is assembled, the electrode plate 15 forms the electrical connection between the piezoelectric element 14 and the cable, thereby obviating the requirement for a soldered connection. This feature is particularly advantageous because the ability to avoid the use of solder improves the function of the device at high temperatures, typically above 300° C., at which temperature the solder may have melted.

The isolator 16 is disposed between the electrode plate 15 and the cap 17. The isolator prevents the equilibrium of the charges on the surfaces of the piezoelectric element 14, by isolating the upper surface of the piezoelectric element 14 from the body of the transducer. In one example, the isolator is formed of a ceramic. The isolator 16 comprises a channel portion 16a, which when assembled isolates the clamped connection between the cable and the electrode plate 15 from the cap 17, and allows the cable to pass therethrough.

The cap 17 seals the elements of the transducer 100 inside. The cap 17 has a threaded section 17a, configured to engage with the external thread of the recess portion 11b of the housing 11. A bottom surface of the cap 17 is shaped to receive the isolator 16.

A central hole 17b is formed in the top surface of the cap 17, in which a gland 18 is received to receive the electrical cable for the transducer. The gland 18 is secured to the opening 17b in the cap 17 by means of cooperating threads. A central opening 18a allows the electrical cable to pass therethrough.

The transducer 100 is assembled in the following manner.

First, the washer 12 is placed in the recess portion 11b of the housing 11. Next, the effector 13 is inserted such that the lower portion 13b passes through the apertures in the washer 12 and the housing 11, whilst the upper portion 13a is retained by the washer 12. It will be understood that the washer 12 may be omitted, in which case the upper portion 13a directly contacts the recess portion 11b.

Next, the piezoelectric element 14 is inserted into the recess 13d of the effector 13, with the upper section 13a facing upward.

Next, the electrical wire is inserted through the opening 18a in the gland 18 and through the central hole 17b in the cap 17, the channel 16a in the isolator 16 and mechanically clamped to the receiving portion 15a of the electrode plate 15.

Next, the electrode plate 15 is brought into contact with the upper and lower electrodes 14a,b and the isolator 16 is brought into contact with the bottom surface of the cap 17. The cap is then screwed into place, with the threaded protrusion section 17a engaging with the thread of the recessed portion 11b.

In use, the transducer 100 is disposed on a pipe. The pipe contains a high temperature fluid, for example in aerospace or nuclear applications.

The effector 13, which protrudes through the bottom of the housing 11, is moved by the vibrations in the body under test. Because the effector 13 is free to move within the transducer housing 11, the vibrations are detected by the piezoelectric element 14, thereby creating an electrical signal.

Advantageously, the transducer 100 is constructed without adhesives or solder, and assembled with mechanical fixtures only. Such adhesives or solder may fail at high temperatures, and so this construction advantageously increases the operating temperature of the transducer 100. Therefore, a temperature of operation above 300° C. is achievable, given that solder would typically melt at 300° C.

Figure 2B:
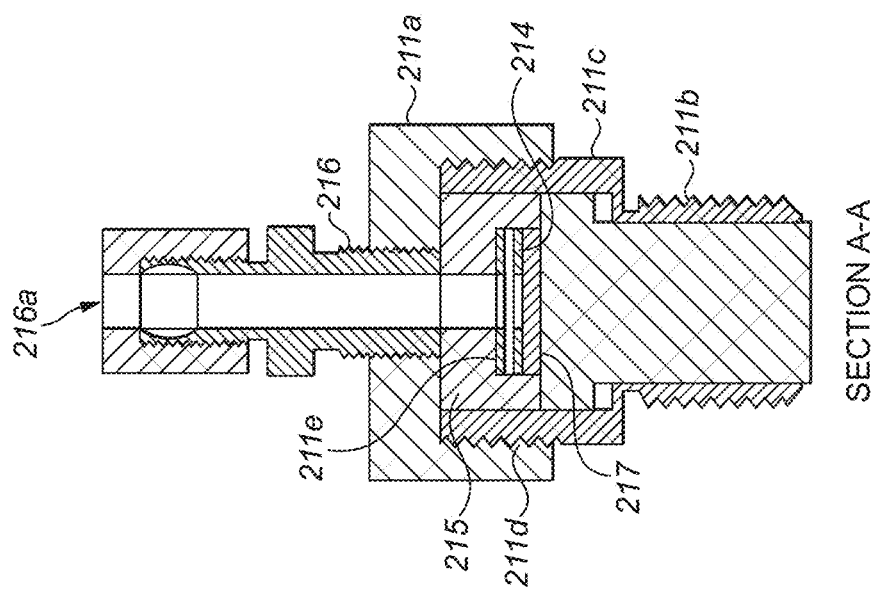
FIG. 2b is a schematic cross-sectional side view of the rangefinding/flaw detecting transducer of FIG. 2(a)
Figure 2A:
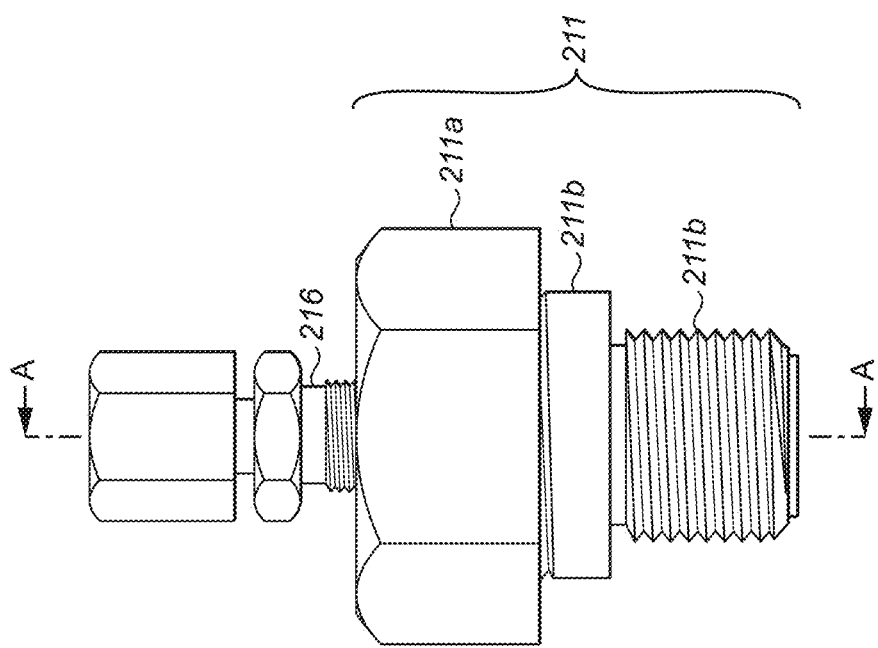
FIG. 2a is a schematic perspective side view of a piezoelectric rangefinding or flaw detecting transducer.

FIG. 2(a) shows a side view of an assembled transducer 200 according to an example embodiment of the present disclosure. The transducer 200 is a high temperature ultrasonic range finder, and capable of operating at temperatures of up to 500° C.

The transducer 200 has a housing 211 comprising an upper portion 211a and a lower portion 211b. The upper and lower portions 211a/b are screwed together by means of complementary threads disposed on the respective portions. Particularly, a top section 211c of the lower portion 211a comprises a thread, as does an interior section 211d of the upper portion 211a.

In this embodiment, the lower portion 211b may act as a waveguide.

In one example, the housing 211 is made from stainless steel.

The top section 211c of the lower portion 211b further comprises a recess 211e, which is adapted to retain the elements of the transducer 200. Particularly, a piezoelectric element 214 is disposed in the recess 211e.

In one example, the upper portion 211a has a central aperture 216a that is threaded, and a threaded tube 216 secures the piezoelectric element 214 in place. The aperture 216a is formed in the threaded tube 216 to allow an electrical wire to pass therethrough.

In this embodiment the piezoelectric element 214 is used as a transducer, both emitting and detecting vibrations. In order to detect a given range from the piezoelectric element 214 to a target a signal is caused to emit from the piezoelectric element 214 by application of a suitable current or voltage to the piezoelectric element 214 from an electrical wire entering the opening 216a and secured to the piezoelectric element 214. The vibrations are then channelled by the lower portion 211b acting as a waveguide towards a target. The vibration signal is then reflected from the target and returns to the piezoelectric element 14 to be converted into an electrical signal for processing and quantifying into a range value.

To help minimise ringing of the piezoelectric element 214 and the housing 211, a backing material 215 is disposed on an upper surface of the piezoelectric element 214. The piezoelectric element 214 may alternatively be located in a recess in the backing material 215.

The backing material 215 scatters and dissipates the energy directed from the rear of the active piezoelectric element 214, which could be reflections of the signal received at the recess that have bypassed the piezoelectric element 14 and been reflected at the back of the recess. Advantageously, the backing material 215 is capable of withstanding the high temperatures at which the device must function.

A backing material must absorb and/or scatter acoustic energy from the rear face of the piezoelectric element 214. There are many ways this can be achieved. The acoustic impedance is given by $Z=\rho c$, where $\rho$ is density and c is the speed of sound in the backing material. The acoustic impedance of the backing material 215 and the piezoelectric material should ideally be substantially matched to absorb and/or scatter acoustic energy.

The amount of energy reflected from the interface between the backing material 215 and the piezoelectric element 214 is given by R. The value of R is minimised when Z is the same for both.

$$R = \left(\frac{Z_2 - Z_1}{Z_2 + Z_1}\right)^2$$

At room temperature, the backing material 215 can be a tungsten loaded polymer, such as epoxy or silicone. In this case the acoustic impedance for the backing material 215 will be similar to the acoustic impedance for a piezoelectric element 214 of PZT, but the fact that the backing material 215 is a composite means it will scatter, like light in frosted glass, based on the tungsten part scattering and the polymer part absorbing.

Examples of materials used for the backing material 215 are a mixture of tungsten or other heavy metal (such as tantalum) with a castable ceramic and or glass.

Alternative materials for use in the backing material 215 include mullite, cordierite, alumina-silicated, ceramic with inhomogeneous structure, or internal porosity. A cylindrical slug of this material could be core-drilled and act as a backing.

Still further examples include metal foam or a sintered metal body, essentially made from metal powder, with internal porosity. Typical materials may be steel or brass.

Alternatively, the backing material may be a solid body, where the body is dense and uniform, but scattering occurs as a result of post-processed features, such as drilled holes, castling, grooves. The scattering occurs due to these features. The backing materials may be a solid body, where the body is porous and graduated in density and porosity.

In one example, the backing material 215 is castable ceramic+50 Wt % tungsten+20% water. In one example, the electrical wire is formed integrally with the backing material 215, and forms part of the lower surface of the backing material 215. The threaded tube 216 secures the backing material 215 to the piezoelectric element 215, thereby enabling an electrical connection between the wire and the piezoelectric element 215.

In further examples, the backing material 215 is instead formed on the surface of the element 215 or bonded to the surface of the element 215.

Bonding relates to the bonding between the piezoelectric element 214 and the backing material 215 and/or the piezoelectric element 214 and a wear plate 217 that is located on the piezoelectric element 214 to provide some protection. These two bonds are important to successful operation of the transducer 200, because the parts need to be coupled acoustically.

Use of high temperature silver adhesives, provides both an electrical contact and acoustic coupling.

Another option is to use dry coupling, such as the use of soft metal, such as copper or gold, or metal near melting point, such as Zn or Zn-alloy. A thin sheet (for example 100 microns thick) placed between the piezoelectric element 214 and the wear face 217 and/or between the piezoelectric element 214 and the backing material 215 can be used. These parts are kept in place by tightening of the threaded tube 216, Another option is to use high temperature couplants, for example fluids designed to work at high temperature.

Another option is to use diffusion bonding, or diffusion welding, to include vacuum brazing. The piezoelectric element 214 is coated with gold by being evaporated on and then bonded to steel (may also be coated), either directly or with an intermediate layer. Heat and pressure can be used to form the bond.

Another option is to use high temperature glass. For example glass powder put at the interface between the piezoelectric element 214 and the wear face 217 and/or between the piezoelectric element 214 and the backing material 215, or a thin glass sheet, which is then heated and stressed to generate the bond.

Defining the performance of piezoelectric materials is notoriously difficult, because the range of temperatures that a piezoelectric is used at and the effect of different temperature profiles to which the piezoelectric is exposed make significant differences to the performance. Nevertheless Table 1 below provides a comparison of piezoelectric materials and gives the activity in $d_{33}$ pm $N^{-1}$ at room temperature, the depoling temperature and the activity in $d_{33}$ pm $N^{-1}$ after a sample has been heated to 380° C. for 1 hour.

TABLE 1

| Material | Room temperature activity/$d_{33}$ pm $N^{-1}$ | Depoling temperature/ C. | Activity after excursion to 380 C. for 1 hour/$d_{33}$ pm $N^{-1}$ |
| --- | --- | --- | --- |
| PZT | 150-500 | 150-380 | <20 |
| BF-KBT-PT | 75-250 | 350-500 | 50-200 |
| Bismuth titanate family: | | | |
| Ferroperm PZ46 | 18 | <650 | 18 |
| Piezo Technlogies K12 | 12 | <820 | 12 |
| Piezo Technlogies K15 | 18 | <650 | 18 |

In the example results above, a device is operated at 380° C. for 1 hour. After 1 hour at this temperature, the PZT has lost most of its activity the performance of the device will have suffered considerably.

Bismuth titanates will not suffer a significant drop in activity, however, the activity is much lower initially.

BF-KBT-PT offers up to 2-15× the activity of bismuth titanate under these conditions.

For applications in the range of activity of 250-500° C. devices made from BF-KBT-PT will have significant advantage over PZT (ability to withstand higher temperatures) and bismuth titanate (sensitivity, activity, functional performance).

In the devices described above all use a piezoelectric element, which may be called a pellet. The pellet can take a number of physical shapes, which may include one or more of the following: circular, square, rectangular, toroidal, and cylindrical. The actuation/transducer vector employed may be thickness mode or radial/transverse or shear. A shear plate may be thickness poled or length poled. There may be single or multiple pellets/bodies. Electrodes may be wraparound for ease of electrical connection.

Other shapes that could be used include: helical, multiple bodies, multilayers, hemispheres, or spheres. The vibration modes may be resonant (related to the dimensions), higher order harmonics (one or mode nodes), or complex harmonic.

Figure 3A:
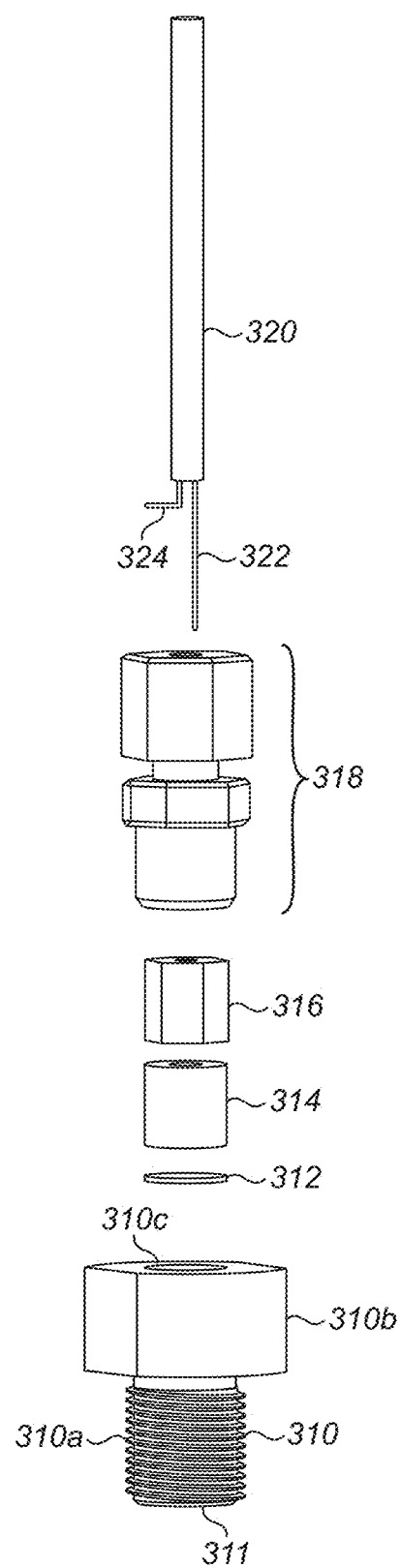
FIG. 3a is a schematic exploded side view of a piezoelectric transducer.
Figure 3B:
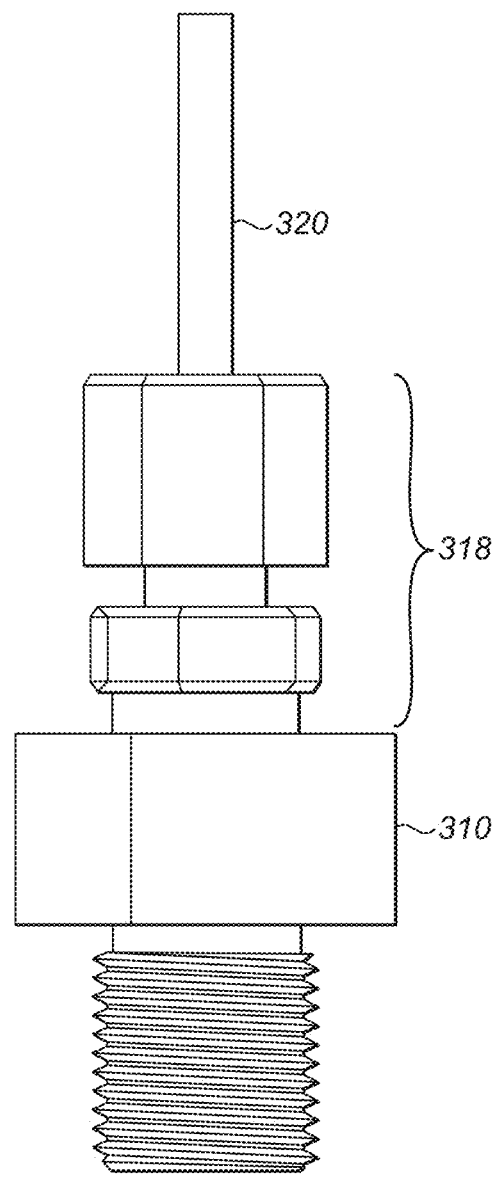
Figure 4:
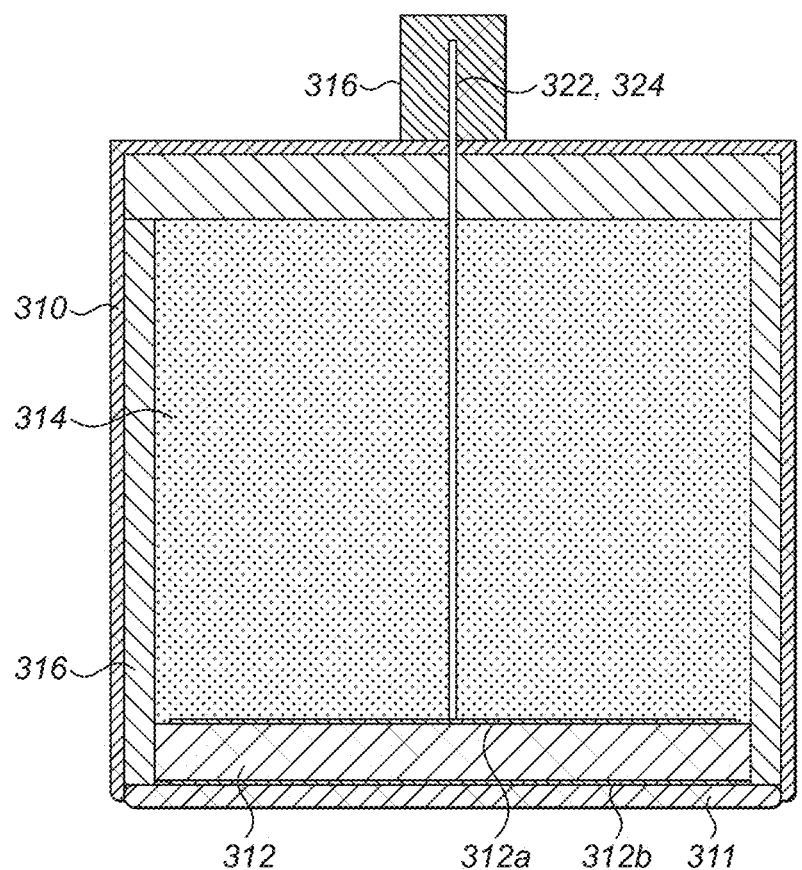
FIG. 4 is a generalised cross-section of the transducer of FIGS. 3a and 3b showing the internal arrangement of parts.

FIGS. 3a and 3b show an example of a 2 MHz piezoelectric transducer suited to operation at high temperatures, such as greater than 200° C., or, preferably, greater than 300° C., preferably up to 400° C., or greater than 400° C., or more preferably up to 500° C., or more preferably up to 600° C. FIG. 4 shows a generalised version of the internal parts of the embodiment.

The piezoelectric transducer comprises an external housing 310, made in this example of 316 stainless steel for temperature and corrosion stability. The external housing 310 is externally threaded at 310a for attachment to a suitable tapped opening. A head 310b of the external housing is hexagonal in plan to allow it to be manipulated or tightened with a spanner.

A lower end of the external housing 310 incorporates a wear plate 311 used to protect the piezoelectric element (discussed below) from wear.

The thickness (t) of the wear plate 311 may be required to be one quarter of the wavelength of vibrations being detected to allow transmission of the sound in phase with the piezoelectric (discussed below) element. Based on speed of sound in 316 S/Steel of 5720 m/s, the thickness of the wear plate 311 should be t=0.715 mm.

Various materials have been considered for the wear plate 311, but to maximise vibration transmission to the piezoelectric element from an item being tested, which will be constructed of 316 stainless steel, the wear plate 311 should also be 316 stainless steel.

Other materials include titanium, which is a good high strength material for thin foils, but is highly attenuating. 316 stainless steel has good thermal and corrosion resistance and is easily machineable. Brass has good acoustic properties but as a copper/zinc alloy has variable temperature effects.

The external housing 310 has a central bore 310c in which is received the piezoelectric element 312, butted up against the wear plate 311. The piezoelectric element 312 sits inside a tubular inner sleeve 316 that has outer measurements corresponding to inner measurements of the bore 310c to allow a tight fit of the inner sleeve 316 in the bore 310c. The piezoelectric element 312 sits in a lower end of the inner sleeve 316. Above the piezoelectric element 312 and also in the inner sleeve 316 sits a backing material 314, which is used in the same way as the backing material mentioned in relation to FIGS. 2a and 2b.

The piezoelectric element 312, backing material 314 and inner sleeve 316 are held in place by a gland 316 that engages with the head 310b of the external housing 310.

A wire holder 320 extends from a top end of the gland 318, with the wire holder 320 holding wires 322 and 324 that are attached to electrodes of the piezoelectric element 312 discussed below.

The piezoelectric element 312 is a piezoelectric ceramic. This can be any ceramic, but the embodiment here is optimised for a bismuth ferrite based ceramic—particularly any of the BF-PT-KBT range materials mentioned above.

To achieve a frequency response of 2 MHz, the piezoelectric element 312 is 0.73 mm thick.

Where for a given member of the BF-PT-KBT family, the relevant characteristics may be:
Density=7850 kg/m3;
Modulus of elasticity=66.9 Gpa;
Speed of sound=2919 m/s
Centre Frequency=2 MHz, the resonant frequency of the piezoelectric within the device
c=2919 m/s, the speed of sound
So wavelength=1.46 mm, related to the dimensions and the speed of sound
Wavelength/2=t
t=0.73 mm The piezoelectric element 312 incorporates upper and lower electrodes 312a, 312b on upper and lower faces of the piezoelectric element 312 respectively. The electrodes 312a, 312b are attached to the wires 322 and 324.

Attachment of electrodes to piezoelectric material can be difficult. For a piezoelectric element 312 made of PZT, suitable materials for the electrodes include precious metal pastes such as silver, gold and platinum, as well as other metals such as copper and nickel, which may be magnetron sputtered.

For high temperature applications, several considerations must be taken into account: oxidation; melting temperature; reaction with the piezoelectric element 312; conductivity; cost the thermal expansion coefficient and adhesion of the electrode to the piezoelectric element 312.

One way to prepare the electrodes is to use metallisation for PZT piezoelectric elements using layers of Cr and Ag, in which a layer of Cr is attached to the piezoelectric element 312 and a layer of Ag is attached to the layer of Cr. However, this method was ineffective with Bi based materials due to thermal mismatch and oxidation of silver within the operational temperature range.

Figure 5:
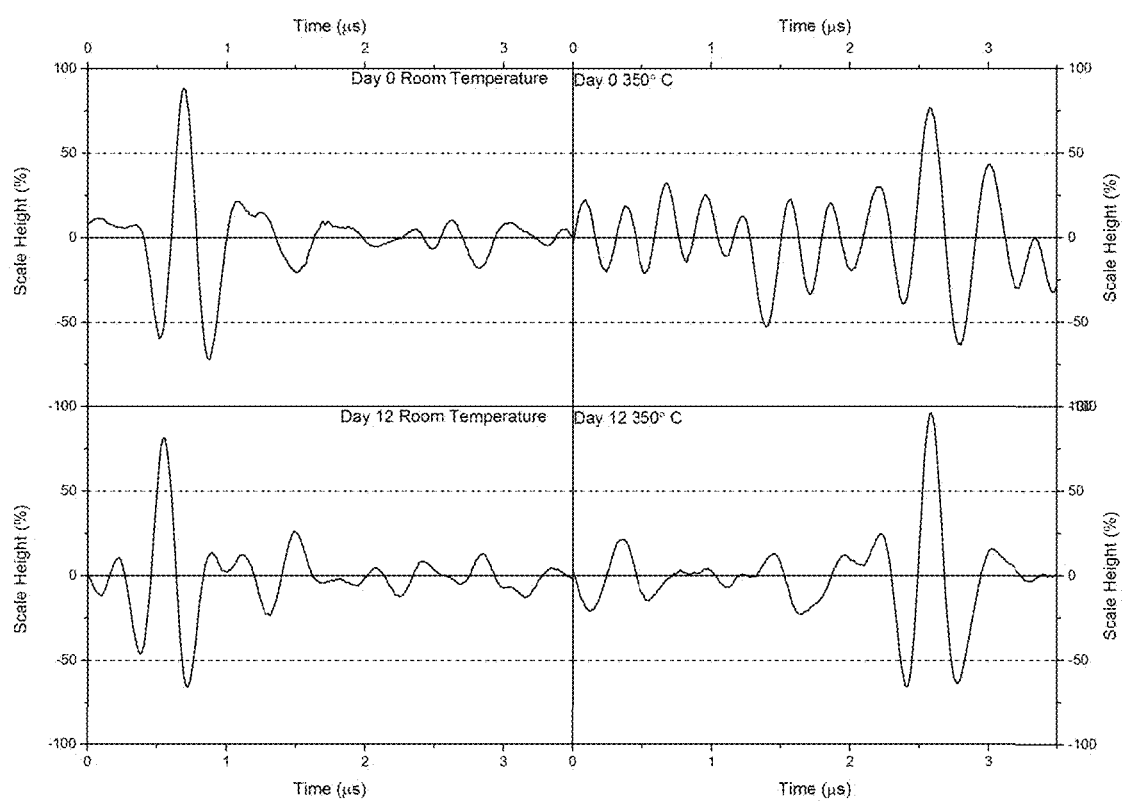
FIG. 5 is a graph of ultrasonic signals transmitted and received from the device shown in FIG. 3b at room temperature and 350° C. before and after a 12 day hold at 350° C.

FIG. 5 shows results from the device shown in FIGS. 3a and 3b, operating at room temperature, at 350° C. after 1 hour, at 350° C. after 12 days, and again on return to room temperature.

The device was shown to return and detect a back-wall echo from a stainless steel test block at room temperature and to return and detect a back-wall echo from the same block heated to a temperature of 350° C. The increase in time of flight of the echo with increasing temperature was detected by the device. The variation in signal intensity varied from −1.2 dB to +0.75 dB indicating stable operation of the device at room temperature and 350° C. before and after a 12 day hold at 350° C. This indicates the stability of the active piezoelectric element 312, housing 310, backing material 314, coupling and electrical connection at temperatures up to 350° C.

Figure 10:
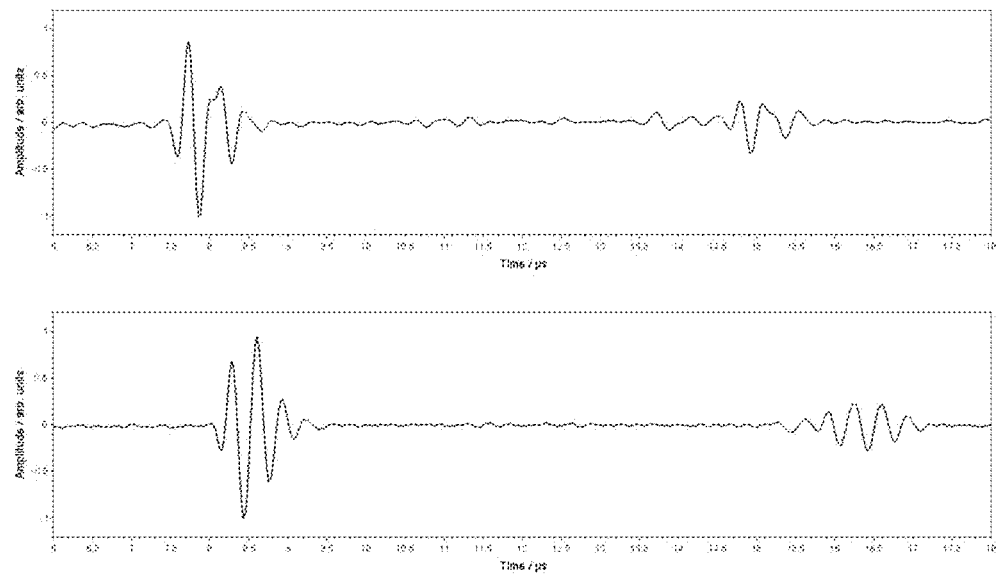
FIG. 10 shows results from the device shown in FIGS. 3a and 3b, operating at room temperature (top), and 600° C. after 1 hour (bottom)
Figure 11:
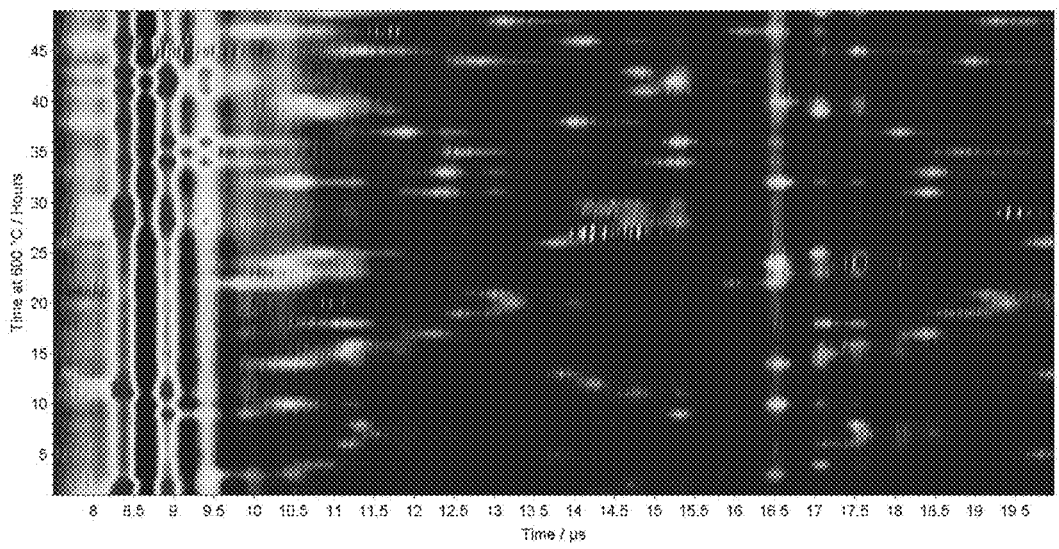
FIG. 11 shows multiple A-scans from the device shown in FIGS. 3a and 3b, operating at 600° C. as a function of time at temperature (y axis) up to 50 hours, with shading showing signal amplitude.

FIGS. 10 and 11 show results for the device of FIGS. 3a and 3b, but at a higher temperature than the FIG. 5 results. FIG. 10 shows results from the device shown in FIGS. 3a and 3b, operating at room temperature (top), and after being held at a temperature of 600° C. for 1 hour (bottom). FIG. 11 shows multiple A-scans from the device shown in FIGS. 3a and 3b, operating at 600° C. as a function of time at temperature (y axis) up to 50 hours. The stability of the results at varying temperatures is shown by the clear trace of results shown by the vertical column, which shows that a clear signal is detected after many hours of the sample being heated to 600° C.

The device was shown to return and detect a back-wall echo from a stainless steel test block at room temperature and to return and detect a back-wall echo from the same block heated to a temperature of 600° C. for a period of time up to 50 hours. The first impulse in the graphs is the outgoing pulse and the second impulse is the returning pulse being detected. The increase in time of flight of the echo with increasing temperature due to the thermal expansion of the steel test block was detected by the device. This indicates the stability of the active piezoelectric element 312, housing 310, backing material 314, coupling and electrical connection at temperatures up to 600° C.

Advantageously the piezoelectric transducer can allow the active element of the transducer to be driven with a 'typical' ultrasonic electric stimulus pulse.

A reduced voltage of the stimulus to below 30 V allows compatibility with intrinsic safety considerations and approvals for use in hazardous environments, for example as described in the international standard IEC 60079. For example, favourably a barrier device, or equivalent electrical circuit which is designed to limit the electrical energy transferred to the hazardous environment, may be used which limits the stimulus to <28 VDC, 300 Ohm, 93 mA for these applications, where typical ultrasonic transducers operate at much higher voltages, typically >100 V.

Advantageously, the piezoelectric element ceramic material described herein displays a significant enhancement in piezoelectric activity ($d_{33}$) compared to other types of 'high temperature' piezoelectric material at elevated temperature (as outlined in pg 2 and in the table below). This allows low voltage electric stimuli to be used without amplification or energy conversion methods, to achieve the same response in other materials at high voltage.

| Material | $d_{33}$ (pC/N) | $T_c$ (° C.) |
|---|---|---|
| $(BiFeO_3)_x$—$(K_{1/2}Bi_{1/2}TiO_3)_y$—$(PbTiO_3)_z$ | >150 | 660 |
| $Bi_4Ti_3O_{12}$ | 3.5 | 675 |
| $Bi_4Ti_{2.86}Nb_{0.14}O_{12}$ | 20 | 655 |
| $(BiScO_3)_{0.36}$—$(PbTiO_3)_{0.64}$ | 460 | 450 |
| PZT Navy Type III | <300 | 305 |

Figure 6:
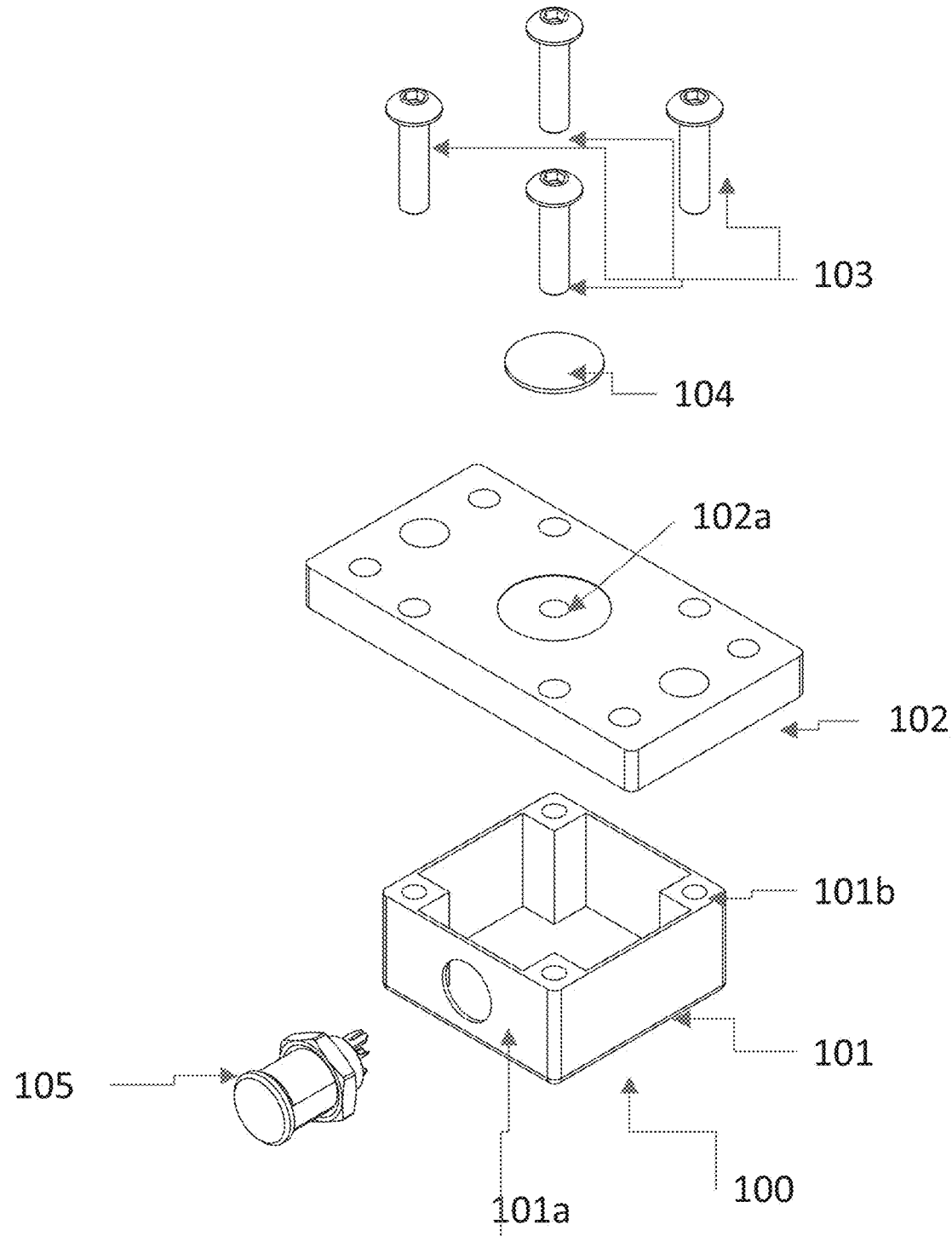
FIG. 6 is a schematic exploded view of an embodiment of transducer for detecting a gas in a liquid
Figure 7:
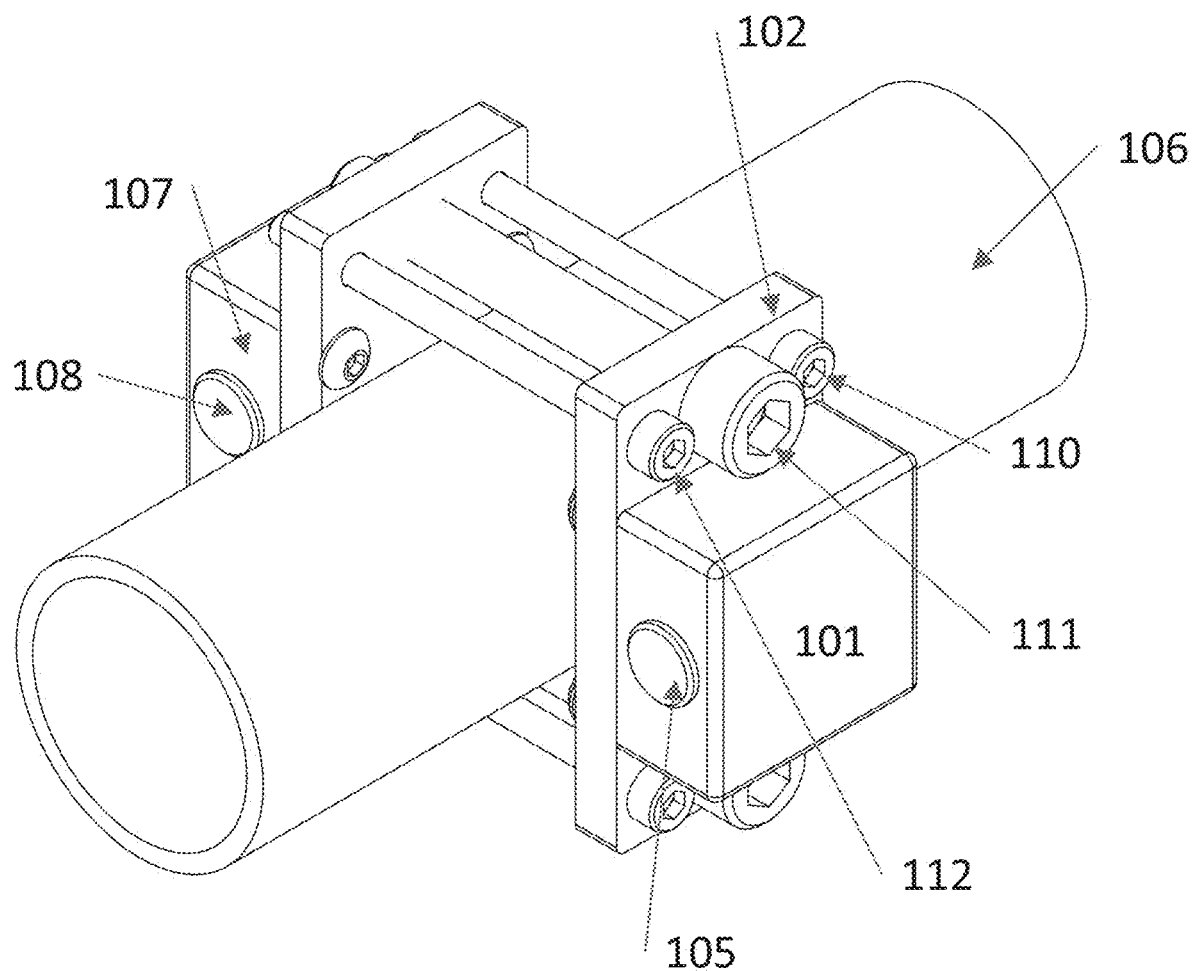
FIG. 7 is a schematic perspective view of the transducer of FIG. 7 attached to a target pipe.

FIGS. 6 and 7 show a piezoelectric transducer device assembly according to an embodiment of the present disclosure. Here, the transducer is a high temperature transducer for sensing the presence and fraction of one or more phases (B &C in the table below) within a matrix (A in the table below) solution suited for operation at high temperatures, such as greater than 200 C, or preferably, greater than 300 C or most preferably, up to 400 C or greater than 400 C, up to or below 660 C. Or alternatively in radioactive environments of up to 65 kGy per hour at or below 660 C.

Where part A in the table below constitutes the largest volume fraction in a solution system, part B in the table below constitutes a smaller volume fraction than A and may be of a different phase or of the same phase but with a different acoustic impedance, and where part C in the table below is one or more phases which constitute subsequent fractions below that of A & B, and can be of different phases from A and/or B, or of the same phase but with a different acoustic impedance. Constituent parts A, B and C may also be Newtonian or Non-Newtonian, linear or non-linear fluids, plus triple point substances, for example, water where multiple phases can coexist in thermodynamic equilibrium, defined by the international temperature scale ITS-90. Examples of solution mixtures are given in the table below.

| Example | Part A | Part B | Part C |
|---|---|---|---|
| 1 | Aviation fuel | Water | Sand and/or Ice |
| 2 | Oil | Air | — |
| 3 | Steam | Water | Voids |
| 4 | Steam | Water | Lime & contaminate particulates |

In FIGS. 6 and 7, a housing 100 is manufactured from stainless steel and comprises tapped openings 101b (see FIG. 6), an electrical connection port 101a and recess 102a in a top plate 102 for affixing a piezoelectric element 104. In this example an aperture in 101a in the housing 101 allows an electrical wire to pass therethrough. The stainless steel may particularly be of type 304 or 316 stainless steel, or alternatively titanium or a nickel alloy containing iron and/or chromium.

The housing consists of an upper portion 101 and lower portion 102 which can be screwed together by means of external screws 103. A seal between 102 and 101 may offer ingress protection to level IP65 and may conform to explosive atmosphere requirements.

In this embodiment the piezoelectric element 104 in housing 100 is used as a transducer, and may detect vibrations or emit vibrations, or may emit and detect vibrations as required during normal operation. Alternatively, in a second housing 107 another piezoelectric element may emit vibrations or detect vibrations respectively for detection or transmission by the piezoelectric element 104 in housing 100, as required during normal operation.

In this embodiment the piezoelectric transducer element 104 is made to function as an electrode on both planar faces with an electrically conductive glass. Electrodes may be of a wraparound type for ease of electrical connection.

Emitting vibrations is effected by electrical stimulus, in this embodiment by the application of a continuous 10 V AC sine wave of multiple frequencies. Detection of vibrations is effected by the piezoelectric material 104 converting the energy to an electrical signal. In both instances the electrical signals are processed by conventional electronics linked by cable which connects to the embodiment through conduits 105 and 108.

To help minimise the performance error in this embodiment, a material, such as a high temperature epoxy resin, may be applied to the front and rear face of the piezoelectric elements 104 to aid adhesion and deliver acoustic coupling and bonding between the piezoelectric element 104 and the recess in the 102a.

In this embodiment the material may act as a faceplate when applied at a thickness of less than ¼ of the acoustic wavelength of operation.

In this embodiment the material may act as a couplant to acoustically couple the piezoelectric elements to the target.

In this embodiment the material may act as a backing material.

In this embodiment the material may act as a waveguide.

In one instance, the material would preferably be a liquid applied thermally cured resin.

Another option is to use high temperature glass, where a thin glass sheet would replace the resin and offer similar properties but substantially matched to the coefficient of thermal expansion.

Figure 8:
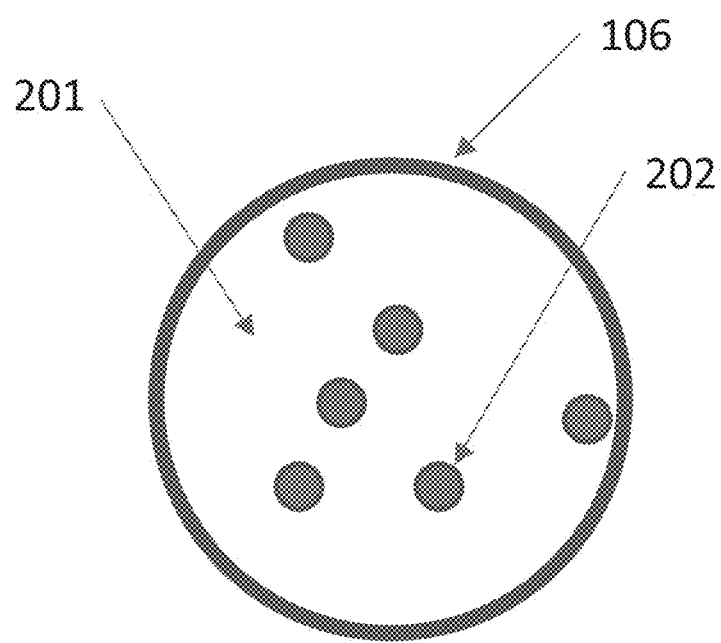
FIG. 8 is a schematic cross-section of the pipe in FIG. 7 showing gas bubbles in a liquid.

In this embodiment the piezoelectric transducer compares the emitted and detected vibration signals electrically to characterise the volume of part B (202) fraction in part A (201) within a pipe 106 containing a mixture or solution as shown in FIG. 8. The solution in this example may make the pipe surface temperatures at or below 660 C.

The embodiment is applied to a pipe 106, where the pipe is DN 1.5, schedule 40 manufactured from stainless steel. Alternatively, the pipe may range in diameter and wall thickness with an inner diameter at or above 3 mm in diameter, and wall thickness at or above 0.5 mm.

In this embodiment the housing 101/107 containing the transducer is affixed to the pipe by way of opposing threaded screws 110 and 111 & 112, where 110 and 112 additionally act as guiding rails to maintain a perpendicular interface to the pipe surface, and where screw 111 acts to tighten or loosen the embodiment and control clamping or removal.

In this embodiment a second set of screws are used on the bottom side to enable sufficient coupling strength, but may not be necessary particularly with smaller diameter pipes.

In this example, part A could be superheated steam and part B water where the difference in emitted and detected signal amplitude correlates to volume fraction. In this embodiment the particles of part B are at or below approximately 1 mm in diameter.

Figure 9:
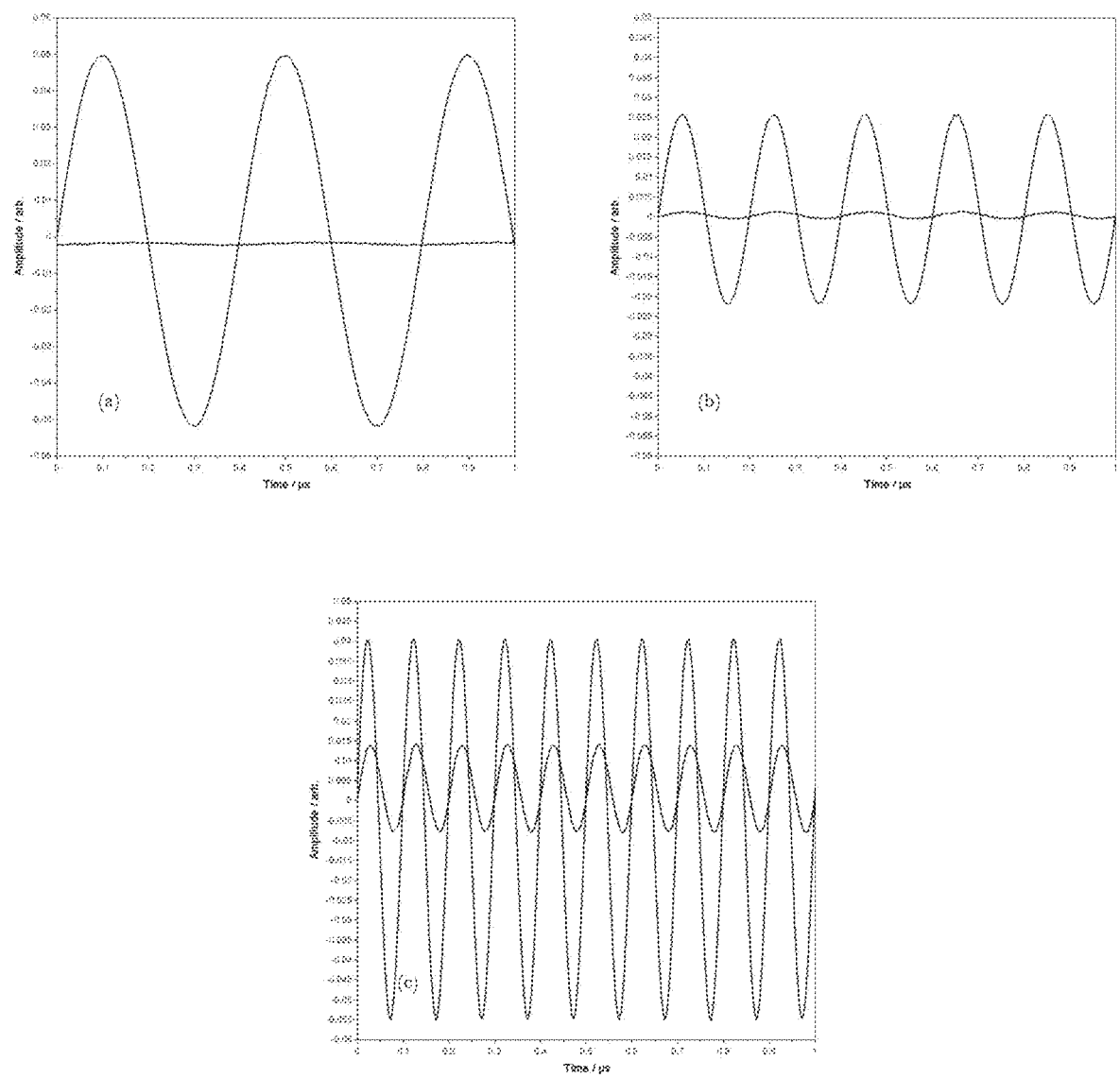
FIG. 9 shows received signals for the embodiment shown in FIG. 7.

In FIG. 9, an example of operation for the embodiment as a function of frequency is shown. FIG. 9 shows the received signals for the embodiment described in FIG. 7, where a continuous sine wave at 10 volts is applied at (a) 2.5 MHz, (b) 5 MHz and (c) 10 MHz. The higher amplitude line corresponds to the detected signal with part A being water at 100%. The lower amplitude line corresponds to the detected signal with the part A being air at >99.9% and part B containing <0.01% air.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The disclosure is not restricted to the details of the foregoing embodiment(s). The disclosure extends to any novel one, or any novel combination, of the features disclosed in this specification (including any accompanying claims, abstract and drawings), or to any novel one, or any novel combination, of the steps of any method or process so disclosed.

The invention claimed is:

1. A piezoelectric transducer comprising:
a piezoelectric element operable to transduce mechanical movement of the piezoelectric element to an electrical signal and to transduce an electrical signal in the piezoelectric element to a mechanical movement thereof; and
a backing material adjacent to the piezoelectric element and adapted to absorb or scatter vibration signals rearward of a target direction with respect to the piezoelectric element, wherein the backing element has an acoustic impedance which is substantially matched to that of the piezoelectric material;
wherein the piezoelectric transducer is operable to transduce above a temperature of 350° C., the backing material being capable of withstanding the temperature at which the transducer must function; and
wherein the piezoelectric element is formed of a ceramic material including a solid solution of formula:

$x(Bi_aK_{1-a})TiO_3\text{-}yBiFeO_3\text{-}zPbTiO_3;$ wherein $0.4 \leq a \leq 0.6$;
$0 < x < 1$;
$0 < y < 1$;
$0 < z \leq 0.5$; and
$x+y+z=1$;
wherein the ceramic is substantially free of non-perovskite phases, other than porosity;
wherein the backing material is a metal foam or a porous sintered metal body; and
wherein the backing material has porosity at or below 20% void volume in the metal matrix.

2. The piezoelectric transducer as claimed in claim 1, in which the backing material is formable in a liquid phase thereof.

3. The piezoelectric transducer as claimed in claim 1, in which the backing material is bonded to the piezoelectric element.

4. The piezoelectric transducer as claimed in claim 1, in which there is an intermediate layer between the piezoelectric material and the backing material.

5. The piezoelectric transducer of claim 1, in which the transducing function of the piezoelectric transducer is a transducing activity of at least 20 $d_{33}$ pm N$^{-1}$, where $d_{33}$ is the piezoelectric charge coefficient, pm is $10^{-12}$ m and N is stress force in Newtons.

6. The piezoelectric transducer of claim 1, in which the transducing function of the piezoelectric transducer has a transducing activity of up to approximately 100 $d_{33}$ pm N$^{-1}$ where $d_{33}$ is the piezoelectric charge coefficient, pm is $10^{-12}$ m and N is stress force in Newtons.

7. The piezoelectric transducer of claim 5, in which the $d_{33}$ value is for a sample of piezoelectric material at room temperature, but which has previously been heated to at least 200° C. for 1 hour.

8. The piezoelectric transducer of claim 1, in which the transducing activity of the piezoelectric material is substantially larger when the piezoelectric material is at a temperature exceeding 200° C., compared to the transducing activity of the piezoelectric material when it is at room temperature (25° C.).

9. The piezoelectric transducer of claim 1, in which the piezoelectric transducer is operable to transduce an electrical signal with at least one of a variety of modes.

10. The piezoelectric transducer of claim 1, in which the transducer incorporates more than one piezoelectric element.

11. The piezoelectric transducer of claim 1, which is operable to transduce an electrical signal having a voltage at or above 3.2 volts.

12. The piezoelectric transducer of claim 1, which is operable to transduce an electrical signal having a voltage at or below 500 volts.

13. The piezoelectric transducer of claim 1, which is operable to transduce an electrical signal having a voltage with a period at or above 80 nanoseconds.

14. The piezoelectric transducer of claim 1, which is operable to transduce with an electrical signal having a frequency at or above 1 kHz.

15. The piezoelectric transducer of claim 1, which includes an effector, operable to detect movement of a target.

16. The piezoelectric transducer of claim 1, in which the backing material includes a titanium alloy foam or a sintered copper alloy.

17. A piezoelectric transducer comprising:
a piezoelectric element operable to transduce mechanical movement of the piezoelectric element to an electrical signal and to transduce an electrical signal in the piezoelectric element to a mechanical movement thereof; and
a backing material adjacent to the piezoelectric element and adapted to absorb or scatter vibration signals rearward of a target direction with respect to the piezoelectric element, wherein the backing element has an acoustic impedance which is substantially matched to that of the piezoelectric material;
wherein the piezoelectric transducer is operable to transduce above a temperature of 350° C., the backing material being capable of withstanding the temperature at which the transducer must function; and
wherein the piezoelectric element is formed of a ceramic material including a solid solution of formula:

$$x(Bi_aK_{1-a})TiO_3\text{-}yBiFeO_3\text{-}zPbTiO_3;$$

wherein $0.4 \leq a \leq 0.6$;
$0 < x < 1$;
$0 < y < 1$;
$0 < z \leq 0.5$; and
$x+y+z=1$;
wherein the ceramic is substantially free of non-perovskite phases, other than porosity;
wherein the backing material is a metal foam or a porous sintered metal body; and
wherein the backing material includes a titanium alloy foam or a sintered copper alloy.

* * * * *